United States Patent
Oowada et al.

(10) Patent No.: US 11,342,029 B2
(45) Date of Patent: May 24, 2022

(54) NON-VOLATILE MEMORY WITH SWITCHABLE ERASE METHODS

(71) Applicant: SANDISK TECHNOLOGIES LLC, Addison, TX (US)

(72) Inventors: Ken Oowada, Fujisawa (JP); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/034,086

(22) Filed: Sep. 28, 2020

(65) Prior Publication Data
US 2022/0101926 A1 Mar. 31, 2022

(51) Int. Cl.
| G11C 16/14 | (2006.01) |
| G11C 16/26 | (2006.01) |
| G11C 16/34 | (2006.01) |
| G11C 16/08 | (2006.01) |
| G11C 16/30 | (2006.01) |

(52) U.S. Cl.
CPC ............ *G11C 16/14* (2013.01); *G11C 16/08* (2013.01); *G11C 16/26* (2013.01); *G11C 16/30* (2013.01); *G11C 16/3445* (2013.01); *G11C 16/3495* (2013.01)

(58) Field of Classification Search
CPC . G11C 16/14; G11C 16/3495; G11C 16/3445; G11C 16/26; G11C 16/08; G11C 16/30
See application file for complete search history.

(56) References Cited

U.S. PATENT DOCUMENTS

| 7,187,591 | B2 | 3/2007 | Fastow | |
| 7,352,629 | B2 | 4/2008 | Chen | |
| 7,430,138 | B2 | 9/2008 | Higashitani | |
| 7,457,166 | B2 | 11/2008 | Hemink | |
| 7,467,253 | B2 | 12/2008 | Yero | |
| 7,518,932 | B2 | 4/2009 | Barkley | |
| 7,633,812 | B2 | 12/2009 | Lutze | |
| 7,751,244 | B2 | 7/2010 | Sekar | |
| 7,839,690 | B2 | 11/2010 | Lee | |
| 7,898,864 | B2 | 3/2011 | Dong | |
| 8,354,322 | B2 | 1/2013 | Ito | |
| 8,456,911 | B2 | 6/2013 | Yuan | |
| 8,788,876 | B2 | 7/2014 | Jeddeloh | |
| 9,208,890 | B2 * | 12/2015 | Lee | G11C 16/3445 |
| 9,805,804 | B2 | 10/2017 | Shiga | |
| 9,934,872 | B2 | 4/2018 | Magia | |
| 10,199,511 | B1 | 2/2019 | Nakaki | |
| 2015/0228348 | A1 * | 8/2015 | Lee | G11C 16/08 365/185.11 |

* cited by examiner

*Primary Examiner* — Jay W. Radke
(74) *Attorney, Agent, or Firm* — Vierra Magen Marcus LLP

(57) ABSTRACT

To improve the erase process, multiple methods of erasing are utilized. A first method of erasing is relied on at the beginning of life of the memory system. A second method is increasingly relied on as the memory system is used and undergoes many program/erase cycles. In one example, the first method of erase includes applying an erase enable voltage separately to different subsets of the word lines while word lines not receiving the erase enable voltage receive an erase inhibit voltage. In one example, the second method of erase includes applying an erase enable voltage concurrently to all subsets of the word lines.

18 Claims, 21 Drawing Sheets

|             | S0 | S1 | S2 | S3 | S4 | S5 | S6 | S7 |
|-------------|----|----|----|----|----|----|----|----|
| Upper Page  | 1  | 1  | 1  | 0  | 0  | 0  | 0  | 1  |
| Middle Page | 1  | 1  | 0  | 0  | 1  | 1  | 0  | 0  |
| Lower Page  | 1  | 0  | 0  | 0  | 0  | 1  | 1  | 1  |

All Erase

Separate Erase Groups

NON-VOLATILE MEMORY WITH SWITCHABLE ERASE METHODS

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (e.g., write) data to the non-volatile memory and later read that data back. For example, a digital camera may take a photograph and store the photograph in non-volatile memory. Later, a user of the digital camera may view the photograph by having the digital camera read the photograph from the non-volatile memory.

All or portions of the non-volatile memory can also be erased. For example, if data becomes stale or is no longer needed, the portion of the non-volatile memory storing the stale or no-longer-needed data can be erased so that the portion of the non-volatile memory can be available for storing new data. Alternatively, the erasing can be used to write data; for example, program from a first state to a second state and erase back to the first state (or between more than two states). The erase process used by the memory system should be accurate so that data is not lost and should be fast enough so that users of the memory system do not experience an unreasonable delay. Additionally, the erase process should be implemented to mitigate side effects that could damage the memory system or lead to data loss.

BRIEF DESCRIPTION OF THE DRAWINGS

Like-numbered elements refer to common components in the different figures.

DETAILED DESCRIPTION

Some methods of erase can be better than others when the memory system is newer, while other methods of erase can be better when the memory system is older. Therefore, to improve the erase process, multiple methods of erasing are utilized. A first method of erasing is more relied on at the beginning of life of the memory system. A second method of erasing is increasingly relied on as the memory system is used and undergoes many program/erase cycles. A program/erase cycle is the performance of both programming and erasing on the same population of memory cells. An example of the first method of erasing is to separately apply erasing to subsets of the non-volatile memory cells being erased. An example of the second method of erasing is to concurrently apply erasing to all of the non-volatile memory cells being erased.

In one embodiment, a control circuit connected to a group of non-volatile memory cells is configured to erase the group of non-volatile memory cells by applying erasing to subsets of the non-volatile memory cells separately and subsequently applying erasing concurrently to all non-volatile memory cells of the group of non-volatile memory cells. The switching from applying erasing to subsets of the non-volatile memory cells separately to concurrently applying erasing to all non-volatile memory cells of the group is based on a metric indicative of the amount of use of the memory cells. For example, the switching can be based on the number of iterations of the erase process (also known as loop count), the magnitude of the erase voltage, the number of program/erase cycles, or other metric.

Figure 1:
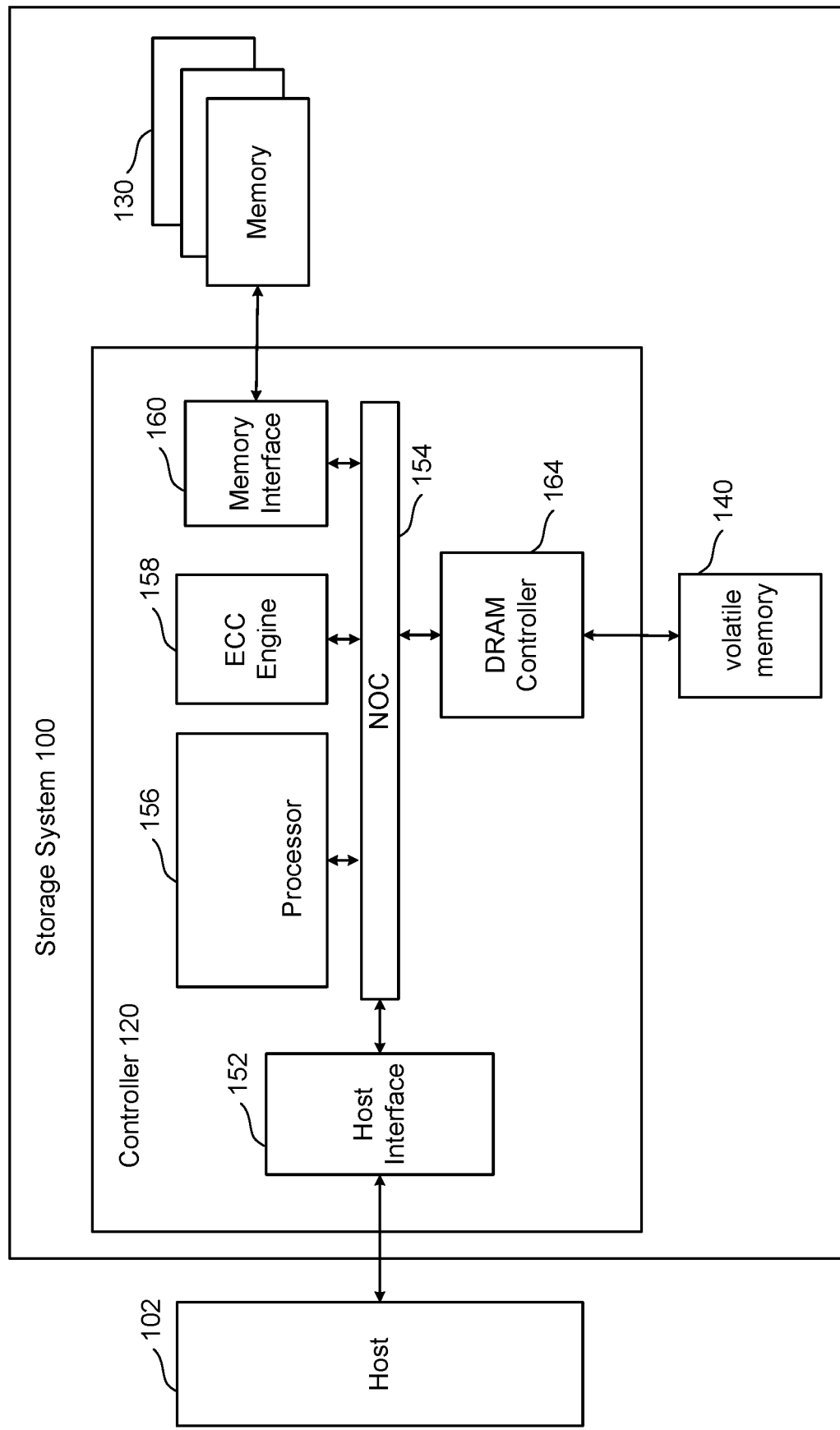
FIG. 1 is a block diagram depicting one embodiment of a memory system.

FIG. 1 is a block diagram of one embodiment of a memory system 100 that implements the proposed technology, including the proposed erased process. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2:
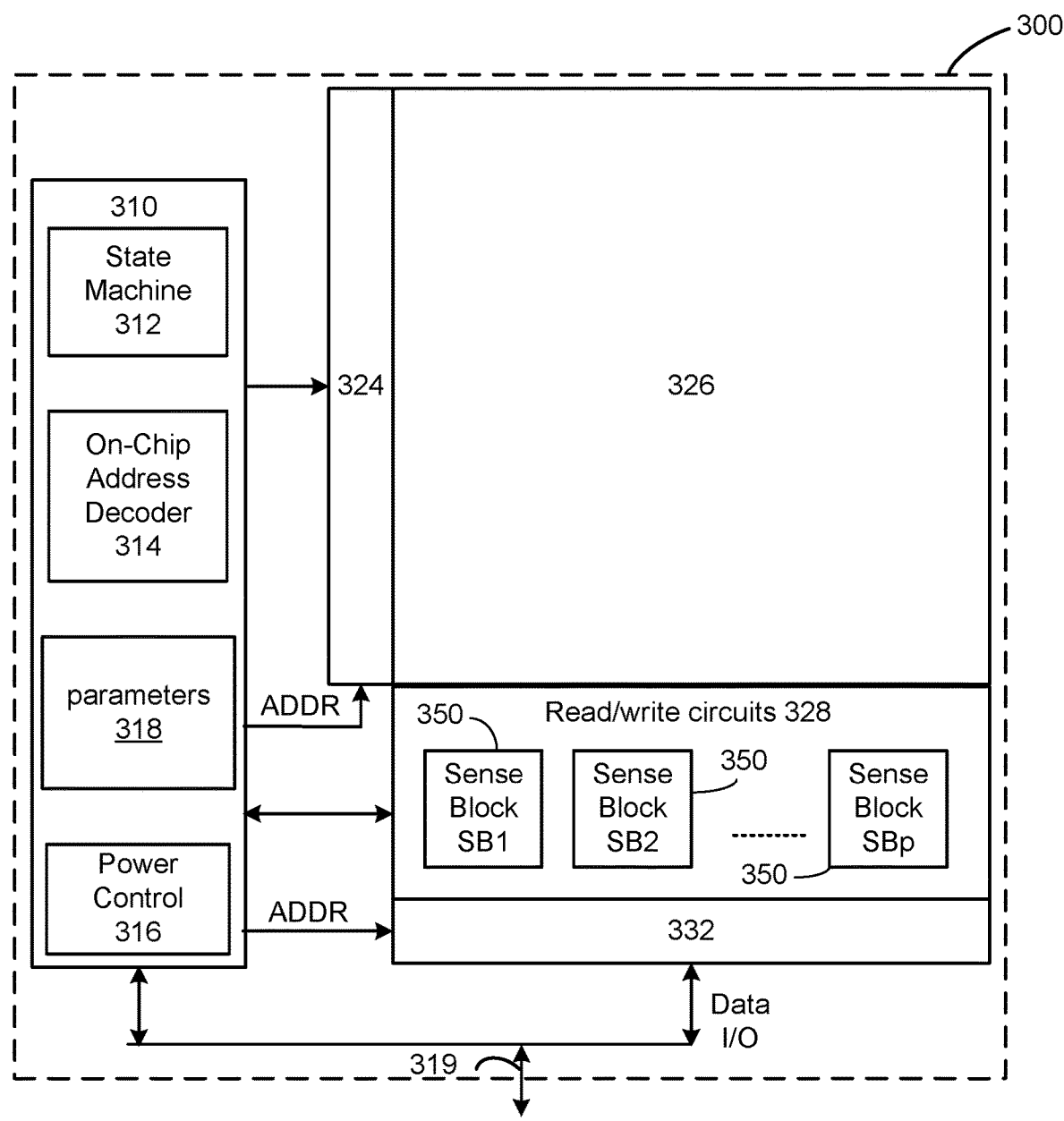
FIG. 2 is a block diagram of one embodiment of a memory die.

FIG. 2 is a functional block diagram of one embodiment of a memory die 300. Each of the one or more memory die 130 of FIG. 1 can be implemented as memory die 300 of FIG. 2. The components depicted in FIG. 2 are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block include a sense amplifier and a set of latches connected to the bit line. The latches store data to be written and/or data that has been read. The sense amplifiers include bit line drivers. Commands and data are transferred between the controller and the memory die 300 via lines 319. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a memory die parameters 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes memory die parameters 318 stored in buffers such as registers, latches, ROM fuses and other storage devices. The memory die parameters 318 are default values such as base voltages and other parameters used by memory die 300 (e.g., used by state machines 312) to perform memory operations.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, read/write circuits 328 and decoders 324/332 comprise one embodiment of a control circuit for memory structure 326. In other embodiments, other circuits that support and operate on memory structure 326 can be referred to as a control circuit. For example, in some embodiments, the controller can operate as the control circuit or can be part of the control circuit. In some embodiments, the controller in combination with control circuitry 310, read/write circuits 328 and decoders 324/332 comprise one embodiment of a control circuit. In another embodiment, state machine 312 comprises the control circuit. In another embodiment, the host can provide the control circuit.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. A NAND string includes memory cells connected by a channel.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
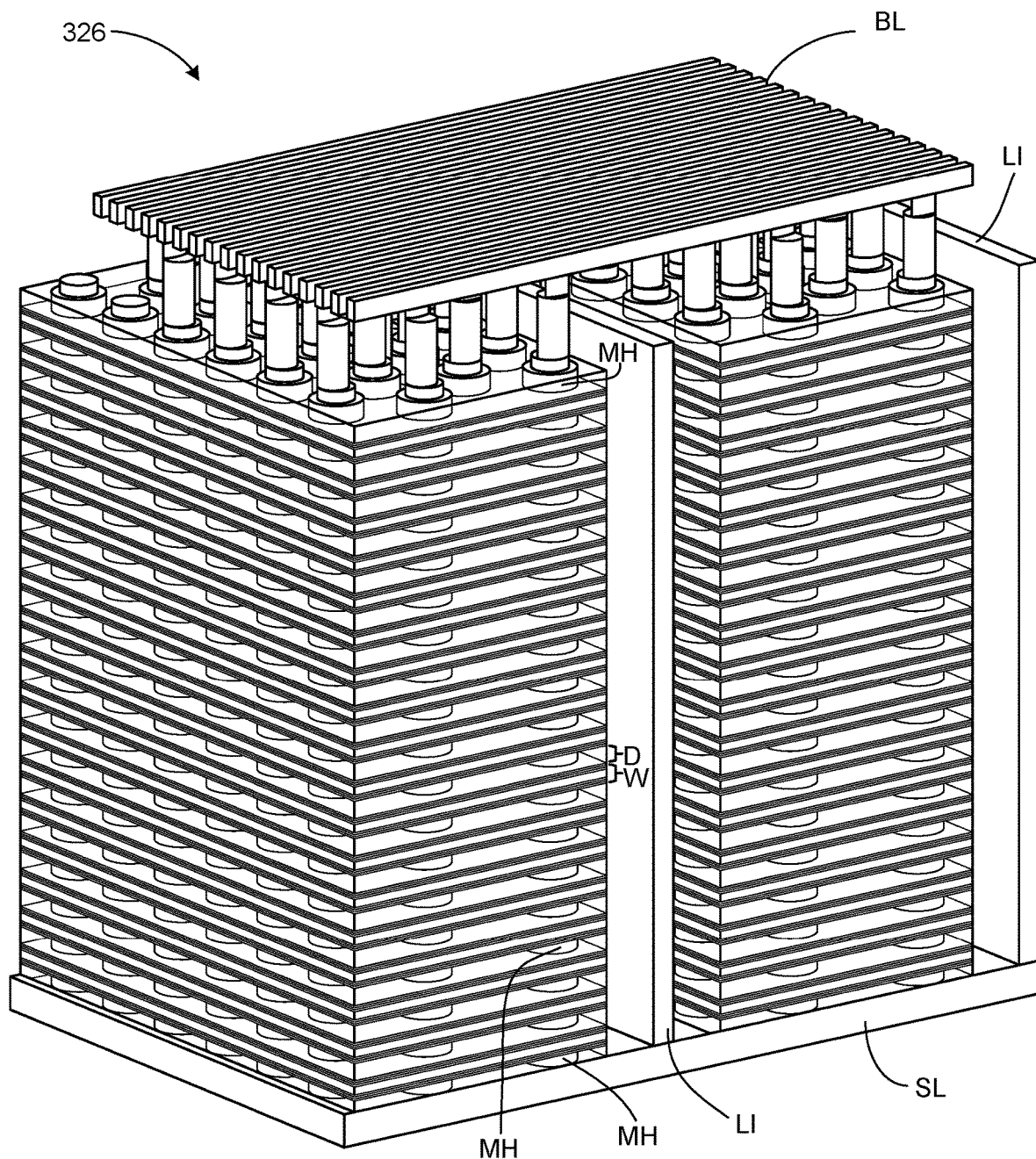
FIG. 3 is a perspective view of a portion of one embodiment of a monolithic three dimensional memory structure.

FIG. 3 is a perspective view of a portion of one example embodiment of a monolithic three dimensional memory array that can comprise memory structure 326, which includes a plurality non-volatile memory cells arranged as vertical NAND strings. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 3 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 326 is provided below with respect to FIG. 4A-4F.

Figure 4A:
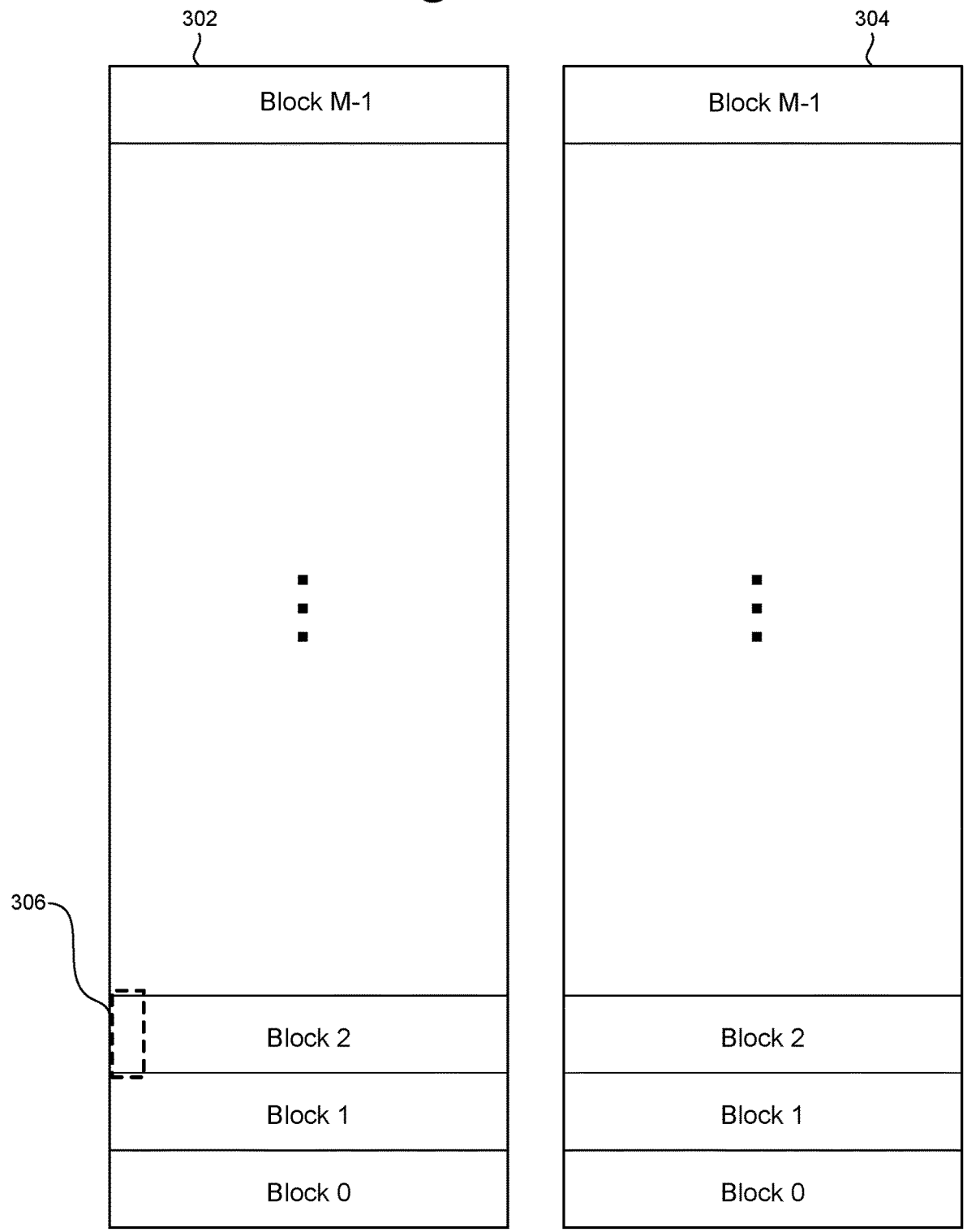
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 326 to enable the signaling and selection circuits. In some embodiments, a block represents a groups of connected memory cells as the memory cells of a block share a common set of word lines.

Figure 4B:
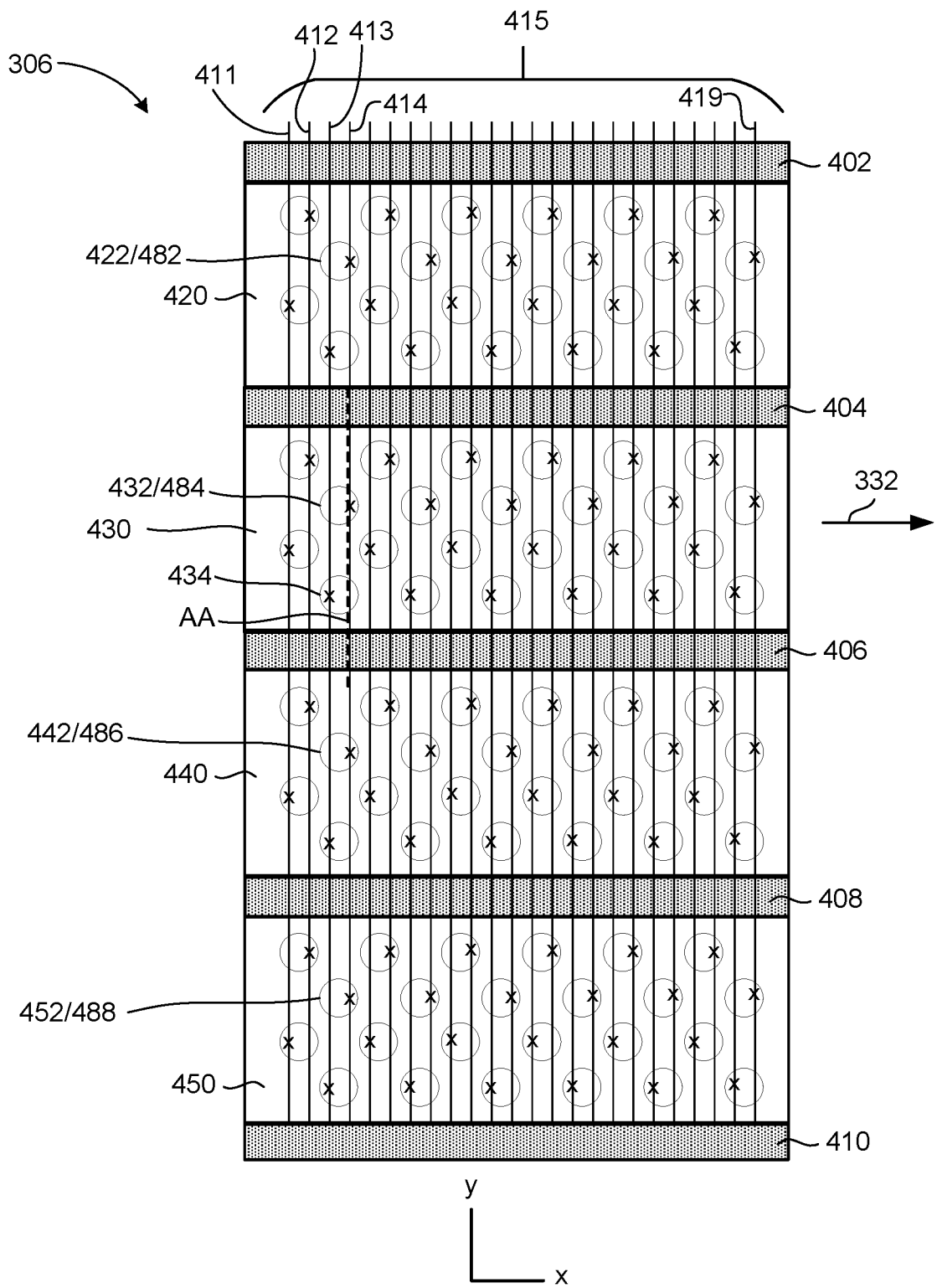
FIG. 4B depicts a top view of a portion of a block of memory cells.

FIGS. 4B-4F depict an example three dimensional ("3D") NAND structure that corresponds to the structure of FIG. 3 and can be used to implement memory structure 326 of FIG. 2. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 332, the block includes more vertical columns than depicted in FIG. 4B

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
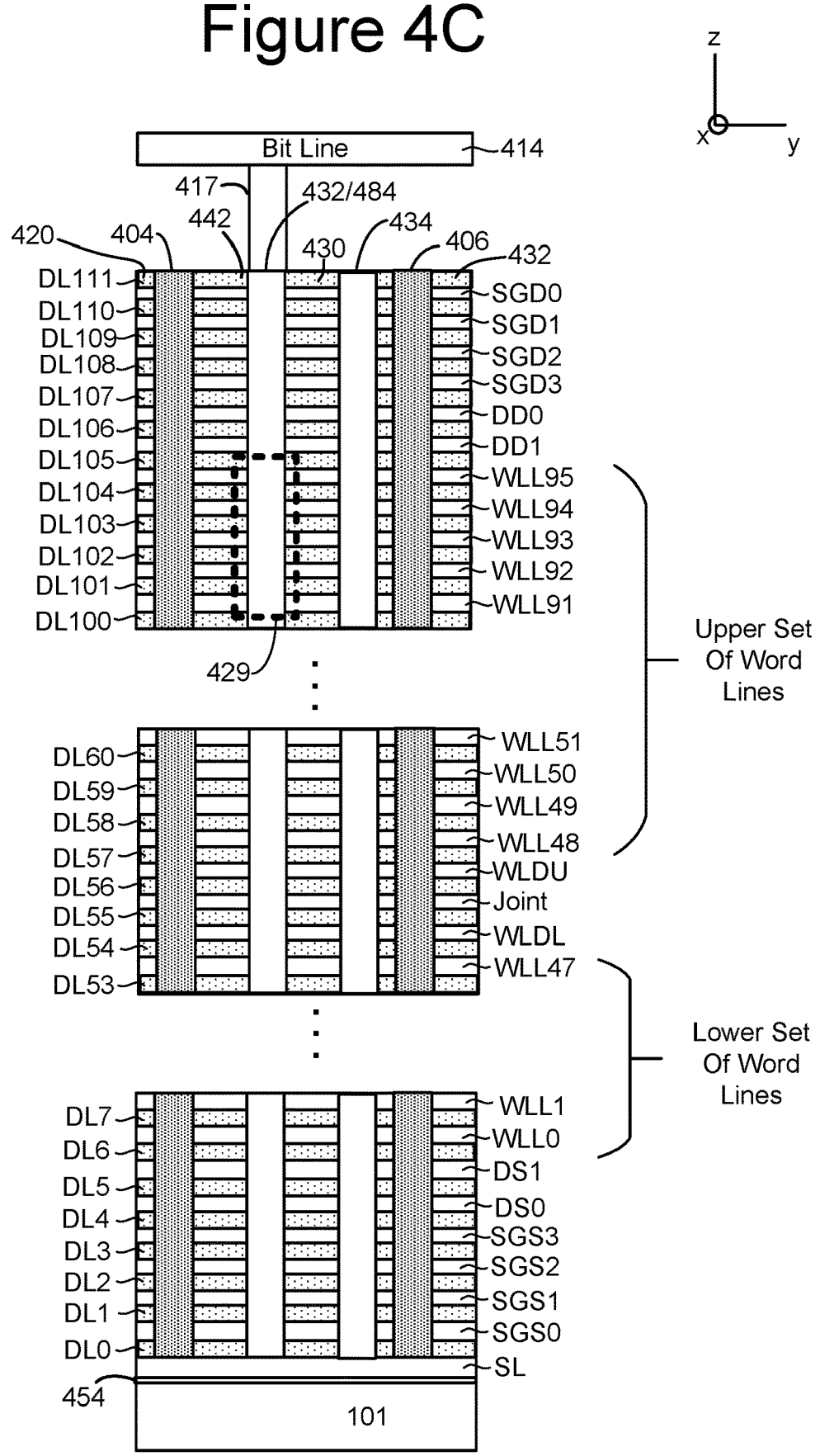
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; six dummy word line layers DD0, DD1, DS0, DS1, WLDL, WLDU; and ninety six data word line layers WLL0-WLL95 for connecting to data memory cells. Other embodiments can implement more or less than four drain side select layers, more or less than four source side select layers, more or less than six dummy word line layers, and more or less than ninety six word lines. Vertical columns 432 and 434 are depicted protruding through the drain side select layers, source side select layers, dummy word line layers and word line layers. In one embodiment, each vertical column comprises a vertical NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 417. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0, DS1, WLDL and WLDU; and word line layers WLL0-WLL95 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL111. For example, dielectric layers DL104 is above word line layer WLL94 and below word line layer WLL95. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL95 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data. In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a Joint area. In one embodiment it is expensive and/or challenging to etch ninety six word line layers intermixed with dielectric layers. To ease this burden, one embodiment includes laying down a first stack of forty eight word line layers alternating with dielectric layers, laying down the Joint area, and laying down a second stack of forty eight word line layers alternating with dielectric layers. The Joint area is positioned between the first stack and the second stack. The Joint area is used to connect to the first stack to the second stack. In FIG. 4C, the first stack is labeled as the "Lower Set of Word Lines" and the second stack is labeled as the "Upper Set of Word Lines." In one embodiment, the Joint area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
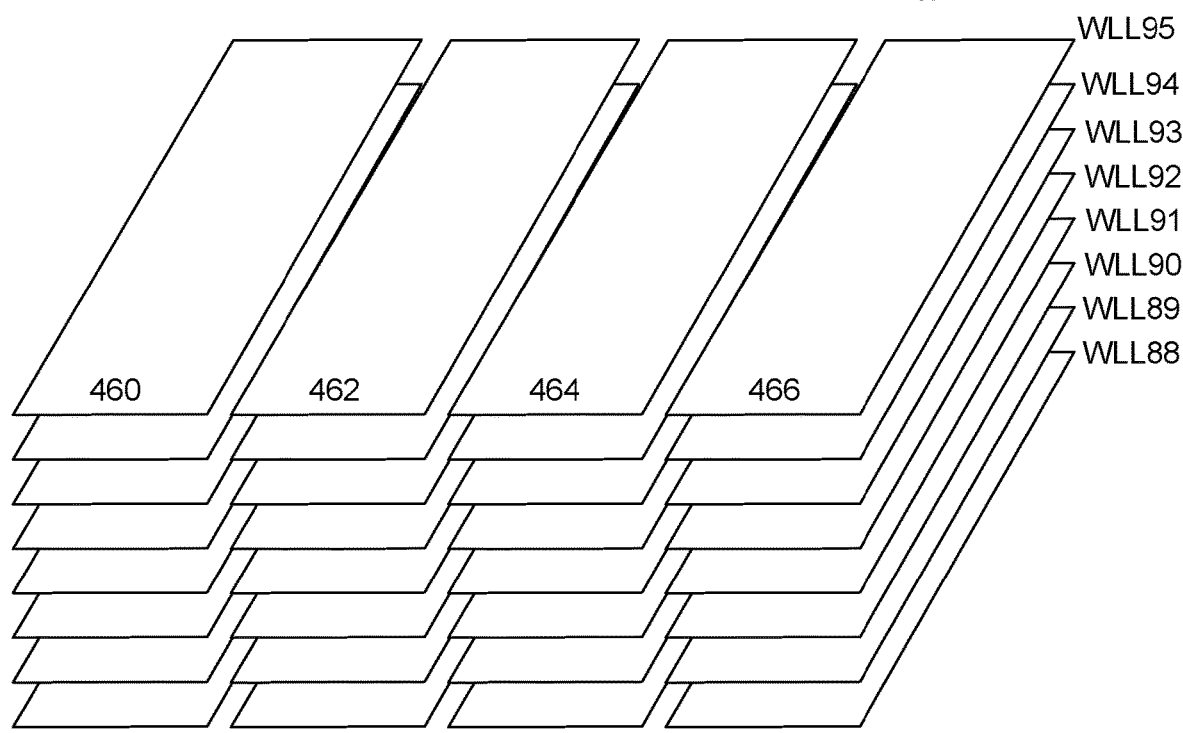
FIG. 4D depicts a view of the select gate layers and word line layers.
Figure 4D:
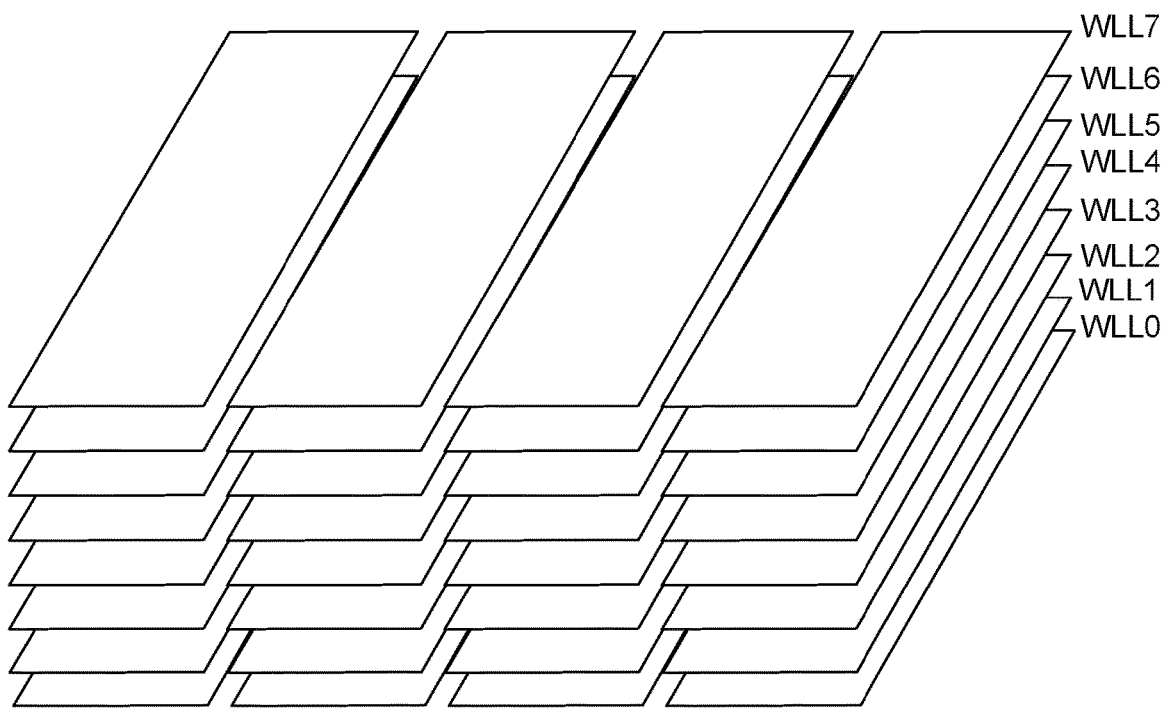

FIG. 4D depicts a logical representation of the conductive layers that comprise word line layers WLL0, WLL1, WLL2, WLL3, WLL4, WLL5, WLL6, WLL7, . . . WLL88, WLL89, WLL90, WLL91, WLL92, WLL93, WLL94, and WLL95 for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL95 is divided into regions 460, 462, 464 and 466. Region 460 is one word line finger on one word line layer. In one embodiment, the four word line fingers on a same level are connected together. In another embodiment, each word line finger operates as a separate word line.

Figure 4E:
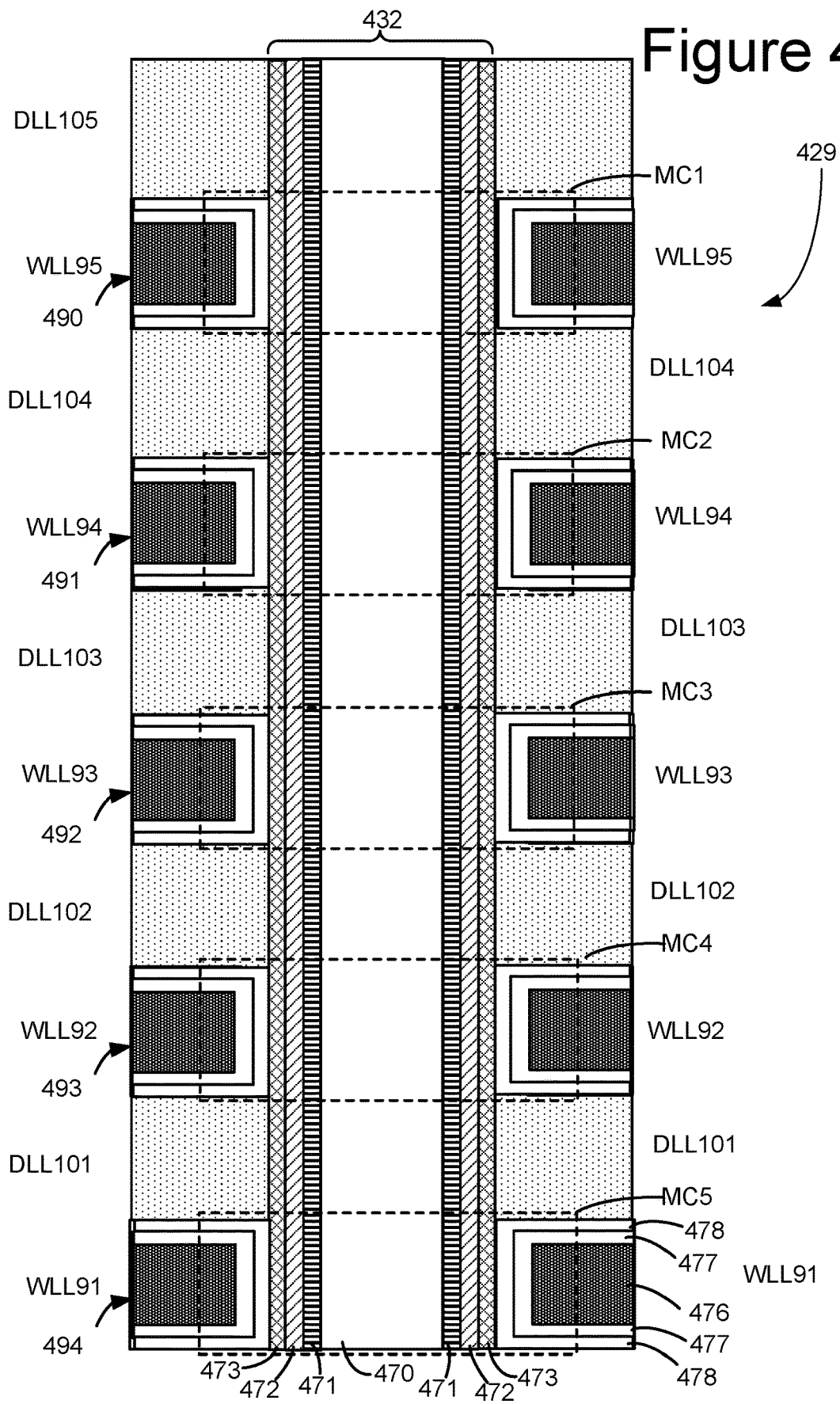
FIG. 4E is a cross sectional view of a vertical column of memory cells.

FIG. 4E depicts a cross sectional view of region 429 of FIG. 4C that includes a portion of vertical column 432 (a memory hole). In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL105, DLL104, DLL103, DLL102 and DLL101, as well as word line layers WLL95, WLL94, WLL93, WLL92, and WLL91. Each of the word line layers includes a word line region 476 surrounded by an aluminum oxide layer 477, which is surrounded by a blocking oxide layer 478. In other embodiments, the blocking oxide layer can be a vertical layer parallel and adjacent to charge trapping layer 473. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL95 and a portion of vertical column 432 comprise a memory cell MC1. Word line layer WLL94 and a portion of vertical column 432 comprise a memory cell MC2. Word line layer WLL93 and a portion of vertical column 432 comprise a memory cell MC3. Word line layer WLL92 and a portion of vertical column 432 comprise a memory cell MC4. Word line layer WLL91 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
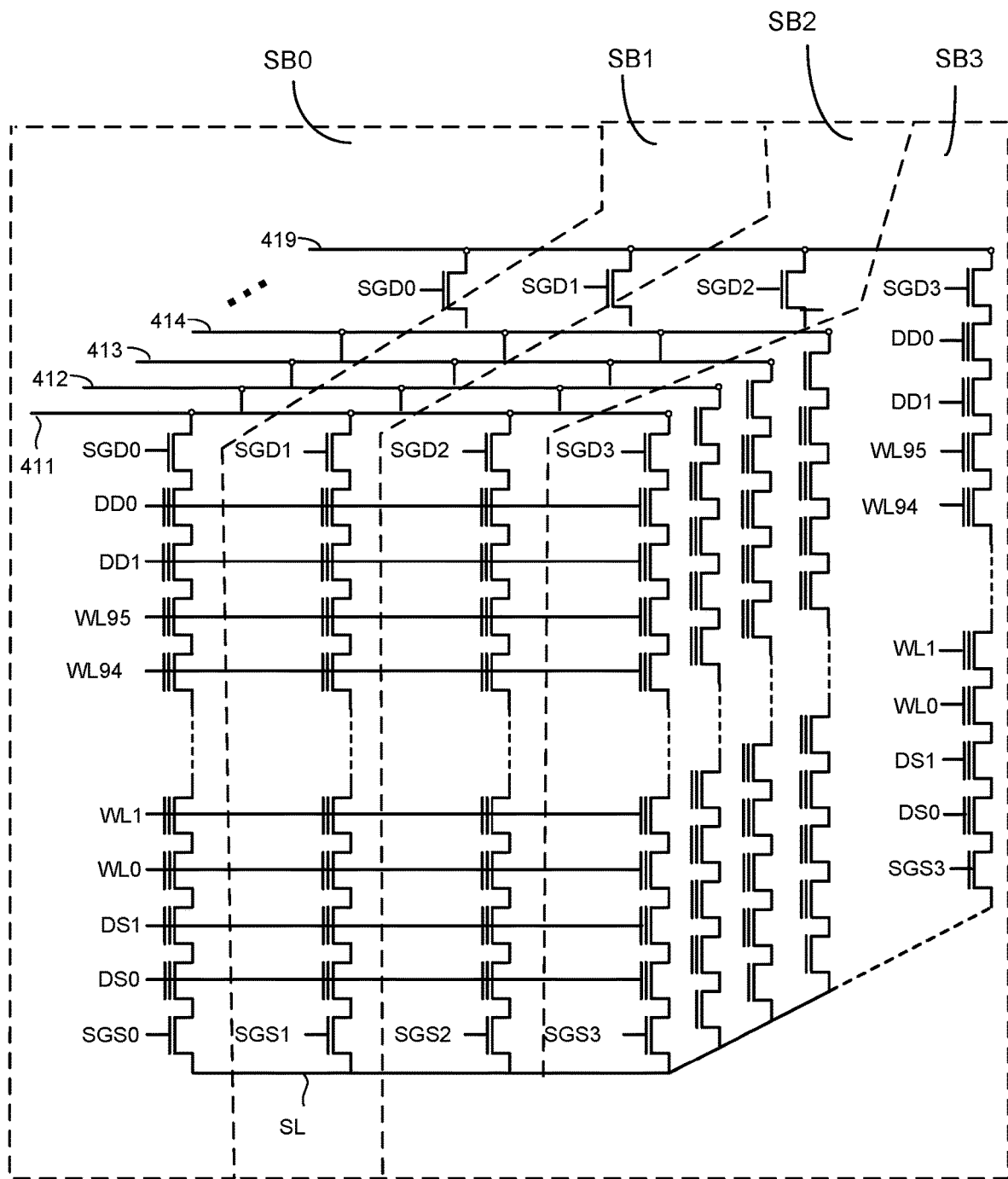
FIG. 4F is a schematic of a plurality of NAND strings showing multiple sub-blocks.

FIG. 4F is a schematic diagram of a portion of the memory depicted in in FIGS. 3-4E. FIG. 4F shows physical word lines WLL0-WLL95 running across the entire block. The structure of FIG. 4F corresponds to portion 306 in Block 2 of FIGS. 4A-E, including bit lines 411, 412, 413, 414, . . . . 419. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

Figures 5, 6:
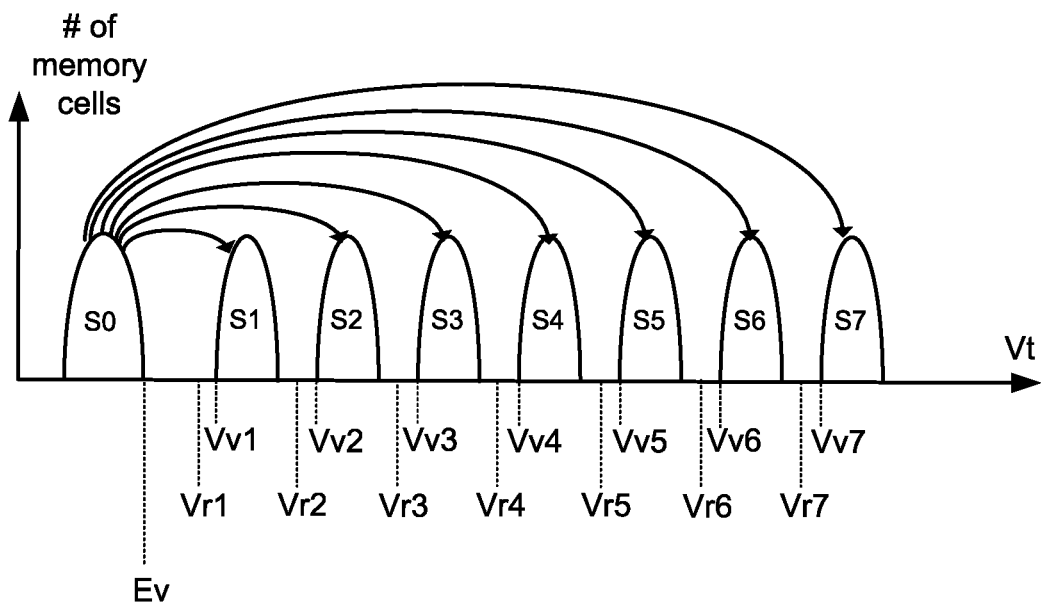
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6 is a table describing one example of an assignment of data values to data states. In the table of FIG. 6, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Ev, Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 7:
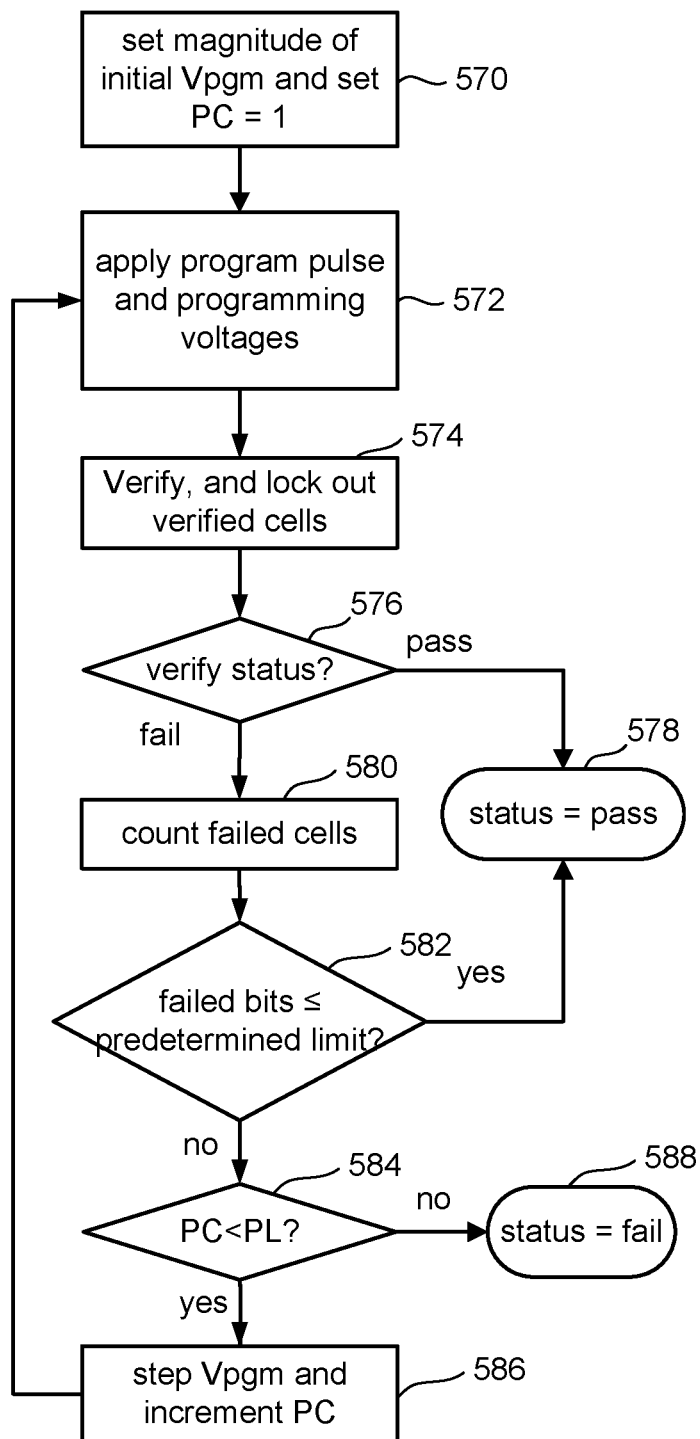
FIG. 7 is a flow chart describing one embodiment of a process for programming non-volatile memory.

FIG. 7 is a flowchart describing one embodiment of a process for programming that is performed by memory die 300. In one example embodiment, the process of FIG. 7 is performed on memory die 300 using the control circuit discussed above, at the direction of state machine 312. The process of FIG. 7 is performed to implement the full sequence programming of FIG. 5, as well as other programming schemes including multi-stage programming. When implementing multi-stage programming, the process of FIG. 7 is used to implement any/each stage of the multi-stage programming process.

Typically, the program voltage applied to the control gates (via a selected word line) during a program operation is applied as a series of program pulses (voltage pulses). Between programming pulses are a set of verify pulses to perform verification. In many implementations, the magnitude of the program pulses is increased with each successive pulse by a predetermined step size. In step 570 of FIG. 7, the programming voltage (Vpgm) is initialized to the starting magnitude (e.g., ~12-16V or another suitable level) and a program counter PC maintained by state machine 312 is initialized at 1. In step 572, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. In one embodiment, if a memory cell should be programmed, then the corresponding bit line is grounded. On the other hand, if the memory cell should remain at its current threshold voltage, then the corresponding bit line is connected to Vdd to inhibit programming. In step 572, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 574, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage.

In step 576, it is determined whether all the memory cells have reached their target threshold voltages (pass). If so, the programming process is complete and successful because all selected memory cells were programmed and verified to their target states. A status of "PASS" (or success) is reported in step 578. If, in 576, it is determined that not all of the memory cells have reached their target threshold voltages (fail), then the programming process continues to step 580.

In step 580, the system counts the number of memory cells that have not yet reached their respective target threshold voltage distribution. That is, the system counts the number of memory cells that have, so far, failed the verify process. This counting can be done by the state machine 312, the controller 120, or other logic. In one implementation, each of the sense blocks will store the status (pass/fail) of their respective memory cells. In one embodiment, there is one total count, which reflects the total number of memory cells currently being programmed that have failed the last verify step. In another embodiment, separate counts are kept for each data state.

In step 582, it is determined whether the count from step 580 is less than or equal to a predetermined limit. In one embodiment, the predetermined limit is a number of bits that can be corrected by error correction codes (ECC) during a read process for the page of memory cells. If the number of failed cells is less than or equal to the predetermined limit, than the programming process can stop and a status of "PASS" is reported in step 578. In this situation, enough memory cells programmed correctly such that the few remaining memory cells that have not been completely programmed can be corrected using ECC during the read process. In some embodiments, step 580 will count the number of failed cells for each sector, each target data state or other unit, and those counts will individually or collectively be compared to one or more thresholds in step 582.

In one embodiment, the predetermined limit can be less than the total number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 584 and the program counter PC is checked against the program limit value (PL). Examples of program limit values include 6, 20 and 30; however, other values can be used. If the program counter PC is not less than the program limit value PL, then the program process is considered to have failed and a status of FAIL is reported in step 588. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.8 volts). After step 586, the process loops back to step 572 and another program pulse is applied to the selected word line so that another iteration (steps 572-586) of the programming process of FIG. 7 is performed.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, controller 120 receives host data (also referred to as user data or data from an entity external to the memory system), also referred to as information bits, that is to be stored non-volatile memory structure 326. The informational bits are represented by the matrix i=[1 0] (note that two bits are used for example purposes only, and many embodiments have code words longer than two bits). An error correction coding process (such as any of the processes mentioned above or below) is implemented by ECC engine 158 of controller 120 in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engine 158) to multiple pages encoded across a number of storage elements, but they do not need to be applied across multiple pages. The data bits can be mapped to a logical page and stored in memory structure 326 by programming one or more memory cells to one or more programming states, which corresponds to v.

In one embodiment, programming serves to raise the threshold voltage of the memory cells to one of the programmed data states S1-S7. Erasing serves to lower the threshold voltage of the memory cells to the Erase data state S0.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Figure 7A:
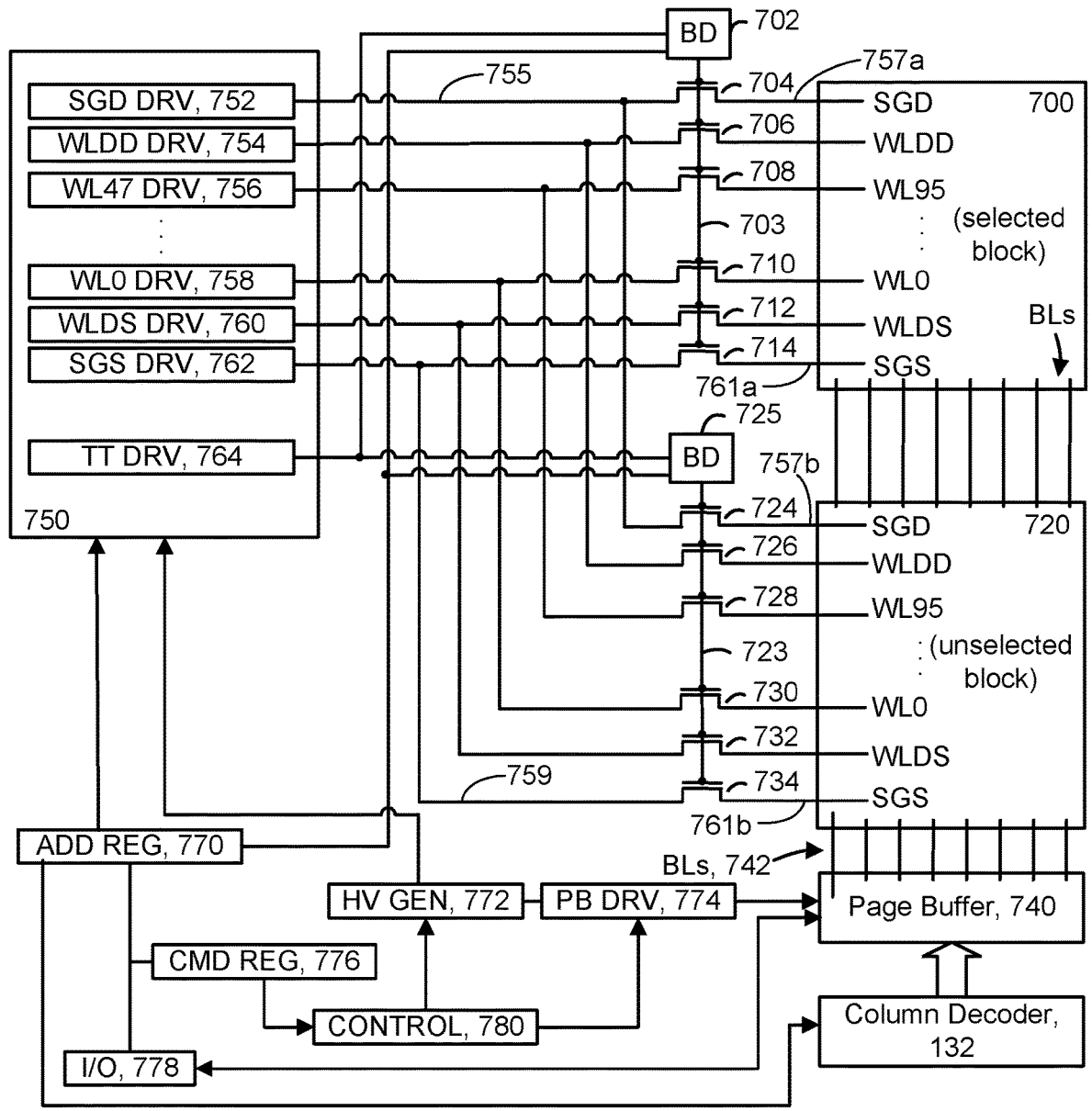
FIG. 7A is a block diagram that shows details of one embodiment of circuits for applying voltages to a memory structure 126.

FIG. 7A is a block diagram that shows details of one embodiment of circuits for applying voltages to a memory structure 326. Two blocks 700, 720 of memory cells are depicted. Circuits of FIG. 7A apply voltages to word lines and select lines. In one embodiment, state machine 312 provides control signals to the circuits. For example, state machine 312 may issue control signals to one or more of CONTROL 780, High Voltage Generator (HV GEN) 772, Page Buffer Driver (PB DRV) 774, Command Register (CMD REG) 776 and Input/Output (I/O) Buffer 778. In one embodiment, state machine 312 issues control signals to CONTROL 780, which in turn controls other elements such as HV GEN 772 and PB DRV 774.

In an embodiment, HV GEN 772 is connected to word line driver 750, to control magnitudes and timing of voltages. In one embodiment, HV GEN 772 provides an erase voltage to the word line driver 750. The erase voltage may be applied by SGD DRV 752 to the select line SGD in one of the blocks 700, 720. The erase voltage may be applied by SGS DRV 762 to the select line SGS in one of the blocks 700, 720.

In one embodiment, HV GEN 772 is connected to PB DRV 774, which is connected to page buffer 740 to control the page buffer 740. The page buffer 740 may include sense blocks, such as SB1 of FIG. 2. In one embodiment, HV GEN 772 provides an erase voltage to the page buffer 740. The erase voltage may be applied to the bit lines 742. In one embodiment, HV GEN 772 provides a temperature dependent erase voltage to the source line (see source line in FIGS. 3, 4C and 4F; the connections to the source line are not depicted in FIG. 7A).

In one embodiment, the combination of the voltages applied to a bit line and to the SGD line are referred to as a GIDL erase voltage. Thus, the HV GEN 772 may provide a GIDL erase voltage to the drain sides of NAND strings.

In one embodiment, the combination of the voltages applied to the source line and to the SGS line are referred to as a GIDL erase voltage. Thus, the HV GEN 772 may provide a GIDL erase voltage to the source sides of NAND strings.

There may be a leakage current along the pathway between the HV GEN 772 and the bit lines 742, the SGD line, the SGS line, and/or the source line. A GIDL erase may depend on having adequate GIDL current in the NAND strings. The leakage current may impact the ability to have an adequate current in the NAND strings. In some embodiment, the HV GEN 772 is controlled in a manner to adjust the erase voltage (to bit lines 742, SGS, SGS, and/or source line) in order to mitigate or compensate for the leakage current. Therefore, an adequate GIDL current flows in the NAND strings such that the GIDL erase operation is efficient. Moreover, the leakage current may be temperature dependent. In some embodiments, the HV GEN 772 is controlled in a manner to mitigate or compensate for the temperature dependent leakage current during a GIDL erase of NAND strings.

Each block of non-volatile storage elements (memory cells) is associated with a set of transfer transistors, in one possible embodiment. For example, block 700, which is a selected block in this example, e.g., a block in which a programming, erase, or sense operation is to take place, includes a drain-side select gate (SGD) connected to a transfer transistor 704, a drain-side dummy word line (WLDD) connected to a transfer transistor 706, a word line (WL95) connected to a transfer transistor 708, intermediate word lines WL94-WL1 (not shown) connected to respective transfer transistors (not shown), a word line (WL0) connected to a transfer transistor 710, a source-side dummy word line (WLDS) connected to a transfer transistor 712, and a source-side select gate (SGS) connected to a transfer transistor 714. Other embodiments can include more dummy word lines (e.g., as depicted in FIG. 4C).

The control gate of each transfer transistor of block 700 is connected to a block decoder (BD) 702 via a common path 703. The BD 702 receives a voltage from a transfer transistor driver (TT DRV) 764 and a control signal from an address register (ADD REG) 770. The control signal includes an address. If the address matches an address of the BD 702, BD 702 acts as a conductive switch which passes the voltage to the control gates of the associated transfer transistors via path 703. If the address does not match the address of BD 702, BD 702 acts as a non-conductive switch which does not pass the voltage to the control gates of the associated transfer transistors.

Each transfer transistor may be an n-channel MOSFET, for example, which has a drain node on the left hand side and a source node on the right hand side. The drain node for each transfer transistor is connected to a respective voltage driver in a set of high-voltage voltage drivers 750. Each driver may include an on-chip charge pump.

For example, the transfer transistor 704 is connected to a drain select gate driver (SGD DRV) 752, the transfer transistor 706 is connected to a dummy word line driver (WLDD DRV) 754, the transfer transistor 708 is connected to the word line driver (WL47 DRV) 756, . . . , the transfer transistor 710 is connected to the word line driver (WL0 DRV) 758, the transfer transistor 712 is connected to the source side dummy word line driver (WLDS DRV) 760, and the transfer transistor 714 is connected to the source select gate driver (SGS DRV). Each voltage driver can be independently controlled to provide a desired output voltage.

A similar arrangement is used for the example unselected block 720, which includes a transfer transistor 724 connected to SGD and SGD DRV 752, a transfer transistor 726 connected to WLDD and WLDD DRV 754, a transfer transistor 728 connected to WL95, . . . , a transfer transistor 730 connected to WL0 and WL0 DRV 758, a transfer transistor 732 connected to WLDS and WLDS DRV 760, and a transfer transistor 734 connected to SGS and SGS DRV 762.

The SGD lines for a plane may be referred to herein as local SGD lines and a global SGD line. For example, the SGD line in block 700 may be referred to as a local SGD line 757*a*. The SGD line in block 720 may also be referred to as a local SGD line 757*b*. The line 755 connected to SGD DRV 752 may be referred to herein as a global SGD line (e.g., SGGg). Each local SGD line 757 may be connected to the global SGD line 755 by a transfer transistor (e.g., 704, 724).

The SGS lines for a plane may be referred to herein as local SGS lines and a global SGS line. For example, the SGS line in block 700 may be referred to as a local SGS line 761*a*. The SGD line in block 720 may also be referred to as a local SGD line 761*b*. The line 759 connected to SGS DRV 762 may be referred to herein as a global SGS line (e.g., SGSg). Each local SGS line 761 may be connected to the global SGS line 759 by a transfer transistor (e.g., 714, 734).

The control gates of the transfer transistors of unselected block 720 are connected to a respective block decoder (BD) 725 via a common path 723. BD 725 also is connected to TT DRV 764 to receive a voltage, and to address register 770 to receive a control signal which instructs BD 725 to pass or not pass the voltage to the control gates of the associated transfer transistors via path 723. Address register (ADD REG) 770 also communicates with the voltage drivers in the set of high-voltage voltage drivers 750.

A number of bit lines (BLs) 742 extend across the selected block 700 and the unselected block 720 (and across additional unselected blocks, not shown, in some implementations) and into a page buffer 740, which is responsive to column decoder 132. Page buffer 740 stores data which are written into, or read from, a selected word line of the selected block.

During an operation of the memory device, address register 770 provides a data load command to an input-output buffer 778 and to a command register 776. Input-output buffer 778 provides the command to page buffer 740. Command register 776 provides a command to a control circuit 780, which instructs a high voltage generator 772 to control voltage drivers 750 at appropriate levels.

Typically, during programming, the driver of the selected word line provides a programming level voltage, such as 12-26 V and the unselected word lines receive a pass voltage VPASS such as 4-6 V. During sensing, the driver of the selected word line provides a read or verify level voltage (VCGR or VVERIFY, respectively), while the unselected word lines receive a read pass voltage, VREAD-PASS. Control 780 also instructs the page buffer driver (PB DRV) 774 to control page buffer 740. Address register 770 also communicates with column decoder 132.

Figure 8:
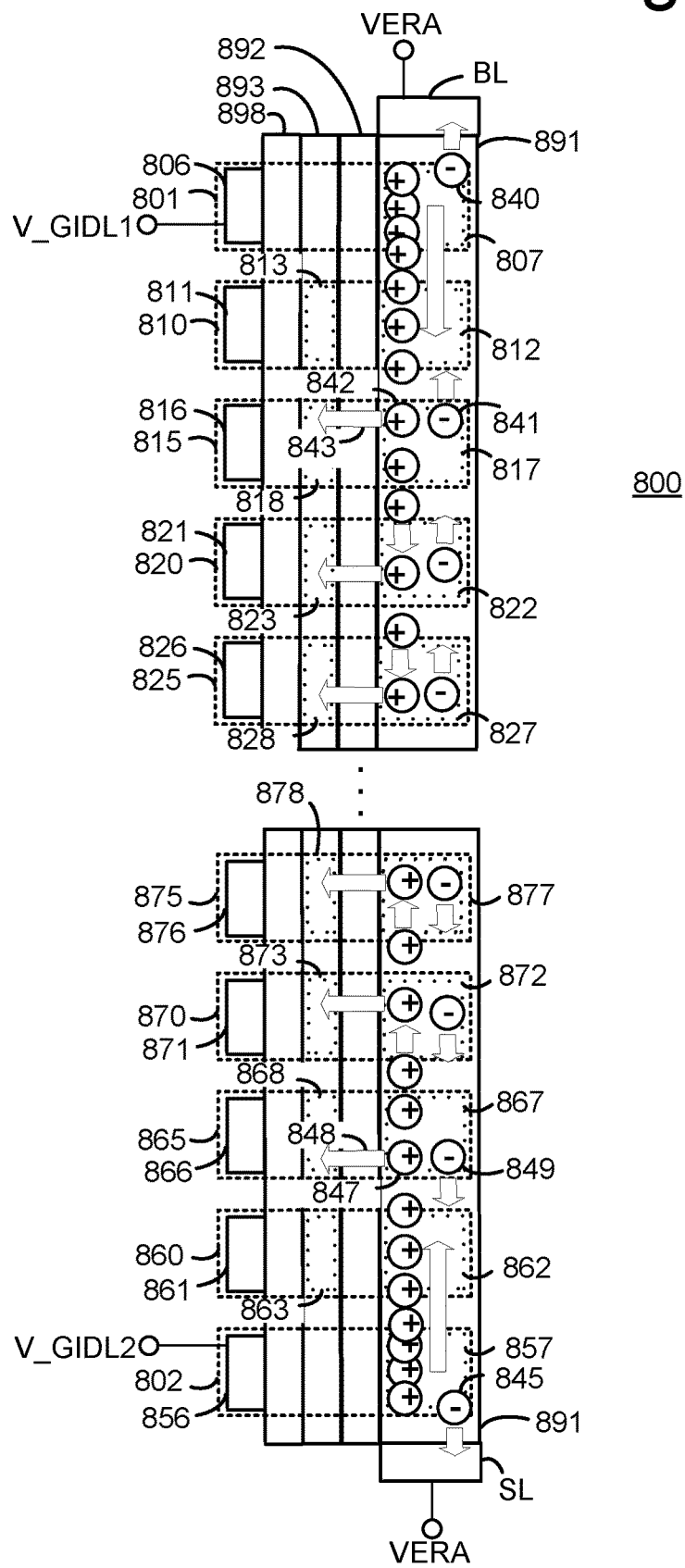
FIG. 8 depicts a NAND string experiencing GIDL erase.

FIG. 8 depicts the movement of holes and electrons in a NAND string during a two-sided GIDL erase. An example NAND string 800 that includes a channel 891 connected to a bit line (BL) and to a source line (SL). A tunnel dielectric layer (TNL) 892, charge trapping layer (CTL) 893, and a blocking oxide layer (BOX) 898 are layers which extend around the memory hole of the string (see e.g., FIG. 4E). Different regions of the channel layers represent channel regions which are associated with respective storage elements or select gate transistors. These channel regions are at a same height and stack level in the stacked memory device as the control gates of the storage elements or select gate transistors.

The NAND string 800 includes an SGD transistor 801 with a control gate 806 and a channel region 807. An erase voltage V_GIDL1 is applied to the control gate 806 of the SGD transistor 801. The NAND string 800 also includes storage elements 810, 815, 820, and 825, control gates 811, 816, 821, and 826, CTL regions 813, 818, 823, and 828, and channel regions 812, 817, 822, and 827, respectively.

The NAND string 800 includes an SGS transistor 802 with a control gate 856 and a channel region 857. An erase voltage V_GIDL2 is applied to the control gate 856 of the SGS transistor 802. The NAND string 800 also includes storage elements 860, 865, 870, and 875, control gates 861, 866, 871, and 876, CTL regions 863, 868, 873, and 878, and channel regions 862, 867, 872, and 877, respectively.

An erase voltage VERA is applied to both the bit line (BL) and to the source line (SL). The difference between VERA and V_GIDL1 may be referred to as ΔGIDL1. The difference between VERA and V_GIDL2 may be referred to as ΔGIDL2. Note that ΔGIDL1 and ΔGIDL2 are examples of GIDL erase voltages. Herein, the term "erase voltage" may be applied to VERA, V_GIDL1, and/or V_GIDL2. An example magnitude for VERA is 21V or 24V, and an example magnitude for V_GIDL1 and V_GIDL2 is 12V. However, it is not required that V_GIDL1 have the same magnitude as V_GIDL2. In some embodiments, ΔGIDL1 and ΔGIDL2 are temperature dependent. Temperature dependence for ΔGIDL1 may be achieved by VERA and/or V_GIDL1 being temperature dependent. Temperature dependence for ΔGIDL2 may be achieved by VERA and/or V_GIDL2 being temperature dependent.

Representative holes are depicted in the channel layers as circles with a "+" sign and representative electrons are depicted in the channel layers as circles with a "−" sign. Electron-hole pairs are generated by a GIDL process. Initially, during an erase operation, the electron-hole pairs are generated at the SGD and SGS transistors. The holes move away from the driven ends into the channel, thereby charging the channel to a positive potential. The electrons generated at the SGD transistor 801 move toward the bit line (BL) due to the positive potential there. The electrons generated at the SGS transistor 802 move toward the source line (SL) due to the positive potential there. Subsequently, during the erase period of each storage element, additional holes are generated by GIDL at virtual junctions which are formed in the channel at the edges of the control gate of the storage element. However, some holes are also removed from the channel as they tunnel to the CTL regions.

Electrons are also generated by the GIDL process. Initially, during the erase operation, the electrons are generated at the SGD and SGS transistors and move toward the driven ends. Subsequently, during the erase period of each storage element, additional electrons are generated by GIDL at virtual junctions, which are formed in the channel at the edges of the control gate of the storage element.

At one end (e.g., drain side) of the NAND string, example electrons 840 and 841 move toward the bit line. Electron 840 is generated at the SGD transistor and electron 841 is generated at a junction of the storage element 815 in the channel region 817. Also, in the drain side, example holes including a hole 842 move away from the bit line as indicated by arrows. The hole 842 is generated at a junction of the storage element 815 in the channel region 817 and can tunnel into the CTL region 818 as indicated by arrow 843.

At the other end (e.g., source side) of the NAND string, example electrons 845 and 849 move toward the source line. Electron 845 is generated at the SGS transistor and electron 849 is generated at a junction of the storage element 865 in the channel region 867. Also, in the source side, example holes including a hole 847 move away from the source line as indicated by the arrow. The hole 847 is generated at a junction of the storage element 865 in the channel region 867 and can tunnel into the CTL region 868 as indicated by arrow 848.

The technology for erasing, described above, can be used with different methods of erase. Two examples of methods of erase include: (1) applying erasing concurrently to all non-volatile memory cells of the unit of erase ("All Erase") and (2) separately applying erasing to subsets of groups of non-volatile memory cells of the unit of erase ("Separate Erase Groups"). Other methods of erase can also be used. Each of All Erase and Separate Erase Groups will be discussed in more detail below.

Figure 9:
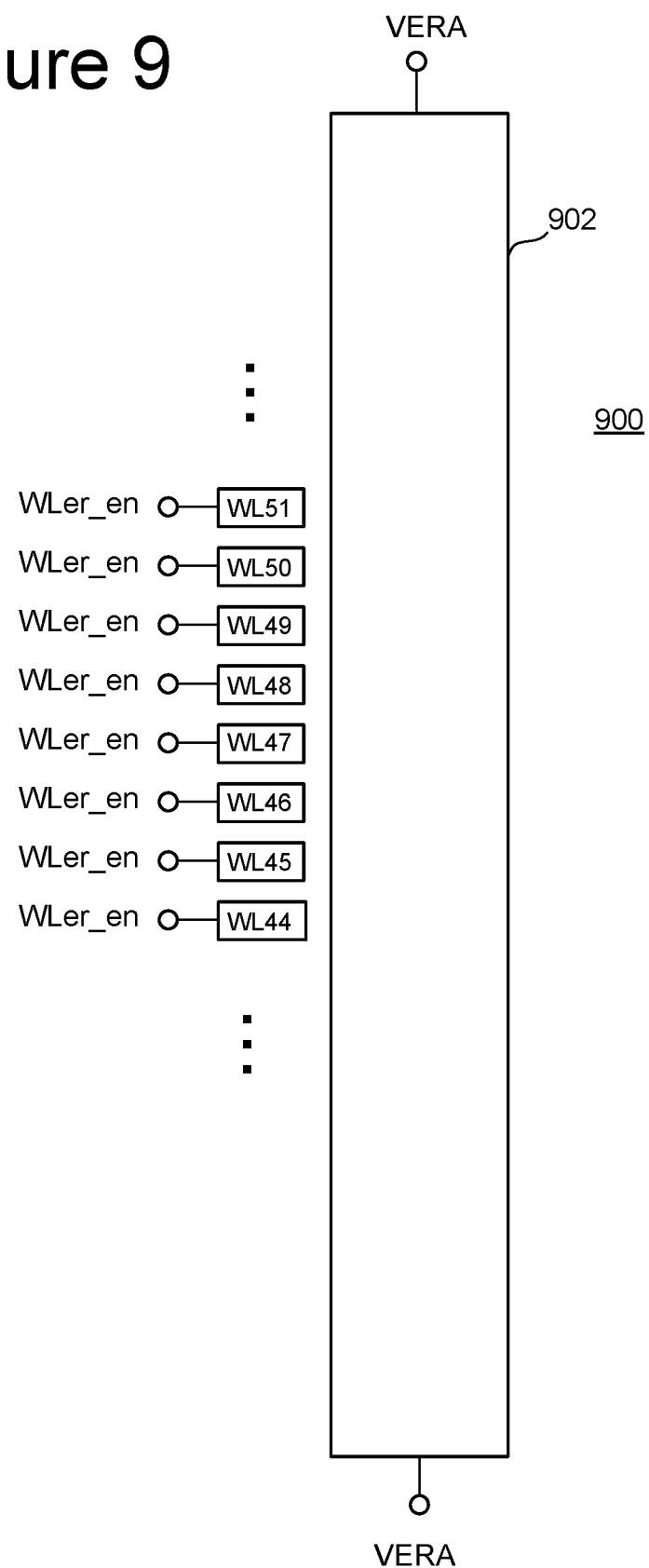
FIG. 9 depicts a portion of a NAND string experiencing erase.

FIG. 9 depicts a portion of a NAND string 900 experiencing erase (e.g., using p-well erase or GIDL erase). FIG. 9 shows channel 902 (which may be an example of channel 471 or channel 891), a subset of word lines (WL44, WL45, WL46, WL47, WL48, WL49, WL50, WL51), and the voltages applied to the word lines during All Erase. The erase voltage VERA is applied to the bit line and source line. As depicted in FIG. 9, all of the word lines in the block of memory cells are receiving erase enable voltage WLer_en. In one embodiment, WLer_en=0v or a value between 0-0.5v. However, other low voltages can also be used. In some embodiments, WLer_en has a voltage magnitude that is as low as possible (negative is theoretically possible, just require additional circuitry to supply negative voltage source). When erase enable voltage WLer_en is applied to a word line and the channel 902 is at a high voltage, the memory cell connected to the word line receiving erase enable voltage WLer_en will experience erasing. With All Erase, all word lines of the block (or other unit of erase or other grouping of word lines) will receive erase enable voltage WLer_en so that all memory cells of all NAND strings that receive the erase voltage VERA will experience erase. In some embodiments, all word lines receive the same exact voltage, while in other embodiments the erase enable voltage may vary by word line. Note that while it is mentioned above that a block of memory cells is the unit of erase, other units of erase can also be used (e.g., partial block, other groupings of word lines, or other groupings of memory cells).

Figure 10A:
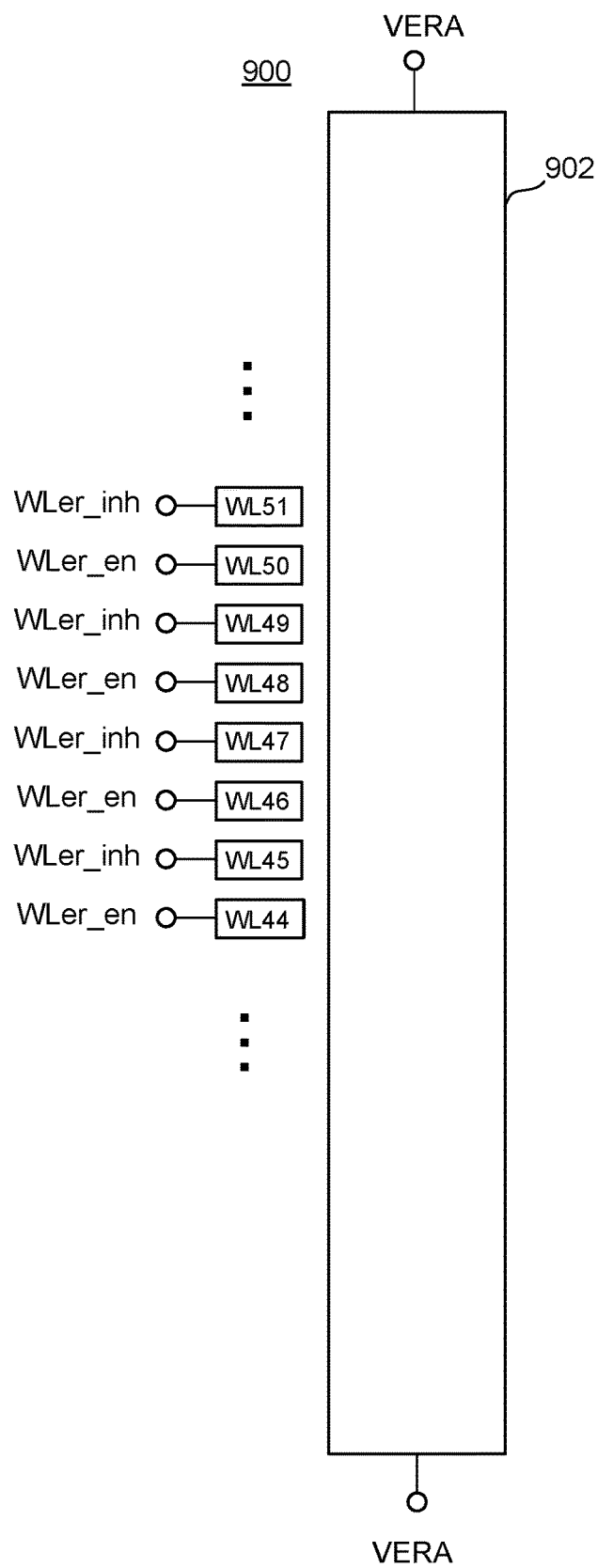
FIG. 10A depicts a portion of a NAND string experiencing erase.
Figure 10B:
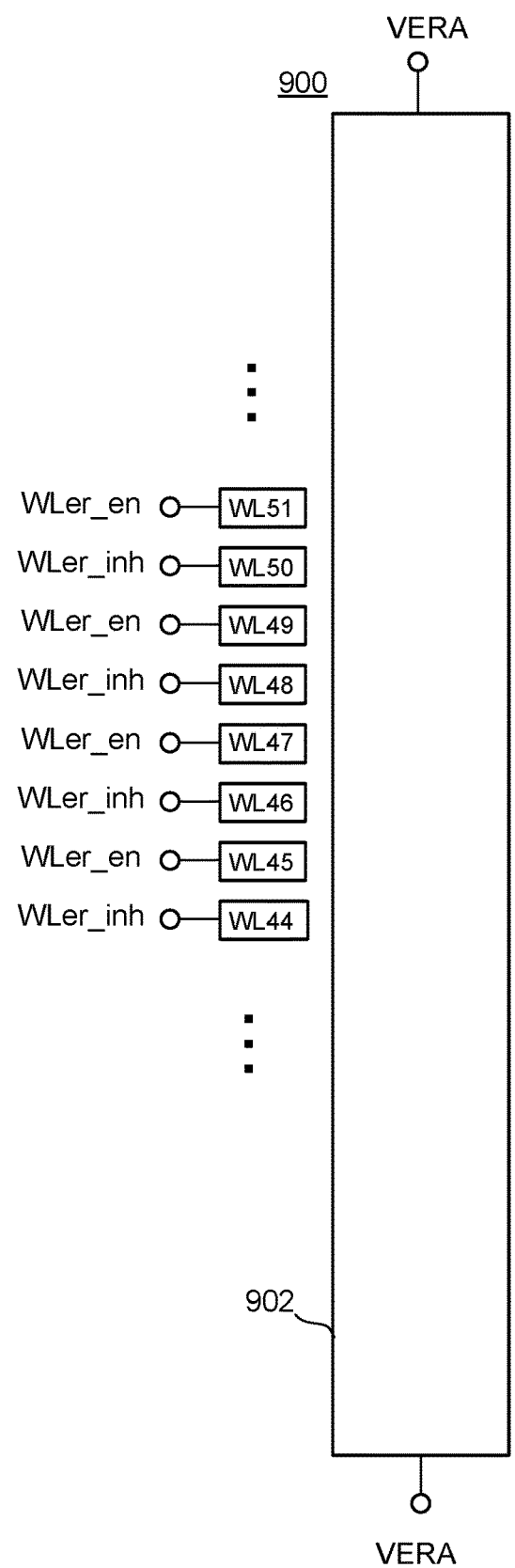
FIG. 10B depicts a portion of a NAND string experiencing erase.

FIGS. 10A and 10B also depict a portion of NAND string 900 experiencing erase (e.g., using p-well erase or GIDL erase). However, in FIGS. 10A and 10B the erase method is Separate Erase Groups. The memory cells are divided into groups of non-volatile memory cells. In one example embodiment, the memory cells are divided into two groups: (1) memory cells connected to even word lines and memory cells connected to odd word lines. Other groupings can also be used. Alternatively, the memory cells can be divided into more than two groups. For example, the memory cells are divided into four groups such that memory cells connected to every fourth word line are in a same group. FIGS. 10A and 10B depict the embodiment where the memory cells are divided into memory cells connected to even word lines and memory cells connected to odd word lines. In the embodiment of FIGS. 10A and 10B, memory cells connected to even word lines are erased together, memory cells connected to even word lines are erased separately from memory cells connected to odd word lines, memory cells connected to odd word lines are erased together, and memory cells connected to odd word lines are erased separately from memory cells connected to even word lines. For example, first memory cells connected to even word lines are erased, while memory cells connected to odd word lines are inhibited from erase. This situation is depicted in FIG. 10A, in which even word lines receive erase enable voltage WLer_en while odd word lines receive erase inhibit voltage WLer_inh. In one embodiment, WLer_inh=10v. However, other high voltages can also be used. In some embodiments, WLer_en<<WLer_inh. When erase inhibit voltage WLer_inh is applied to a word line and the channel 902 is at a high voltage, the memory cell connected to the word line receiving erase inhibit voltage WLer_inh will not experience erasing. In some embodiments, all word lines that receive WLer_inh will receive the same exact voltage, while in other embodiments the erase inhibit voltage may vary by word line. Subsequent to the memory cells connected to even word lines experiencing erase, the memory cells connected to odd word lines will experience erase while memory cells connected to even word lines are inhibited from erase. This situation is depicted in FIG. 10B, in which odd word lines receive erase enable voltage WLer_en while even word lines receive erase inhibit voltage WLer_inh. Note that the order of erase can be even-odd or odd-even. Note that FIGS. 10A and 10B show the erase voltage VERA being applied to the bit line and source line.

Figure 11:
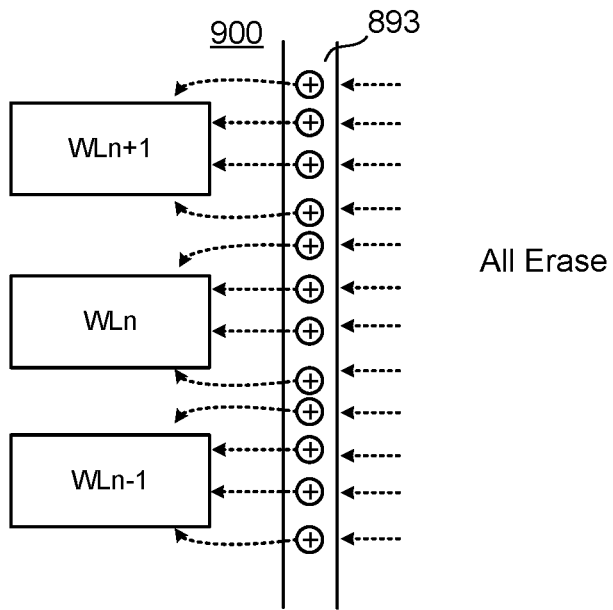
FIG. 11 depicts a portion of a NAND string experiencing erase.

FIG. 11 is a block diagram that describes the physics of the erase process for NAND string 900 using the All Erase method. In response to applying WLer_en on all of the word lines, holes are injected into charge trapping layer 893. Some holes are further injected into the word lines and into the dielectric/oxide between word lines. A possible result of having holes injected into the dielectric/oxide between word lines is that the memory cells may experience data retention issues over a long period of time. That is, lateral hole movement may cause changes in threshold voltages of the memory cells, which can potentially lead to errors. It has been found that holes are injected into the dielectric/oxide between word lines because of the difference in voltage between the channel and the neighboring word line.

Figure 12:
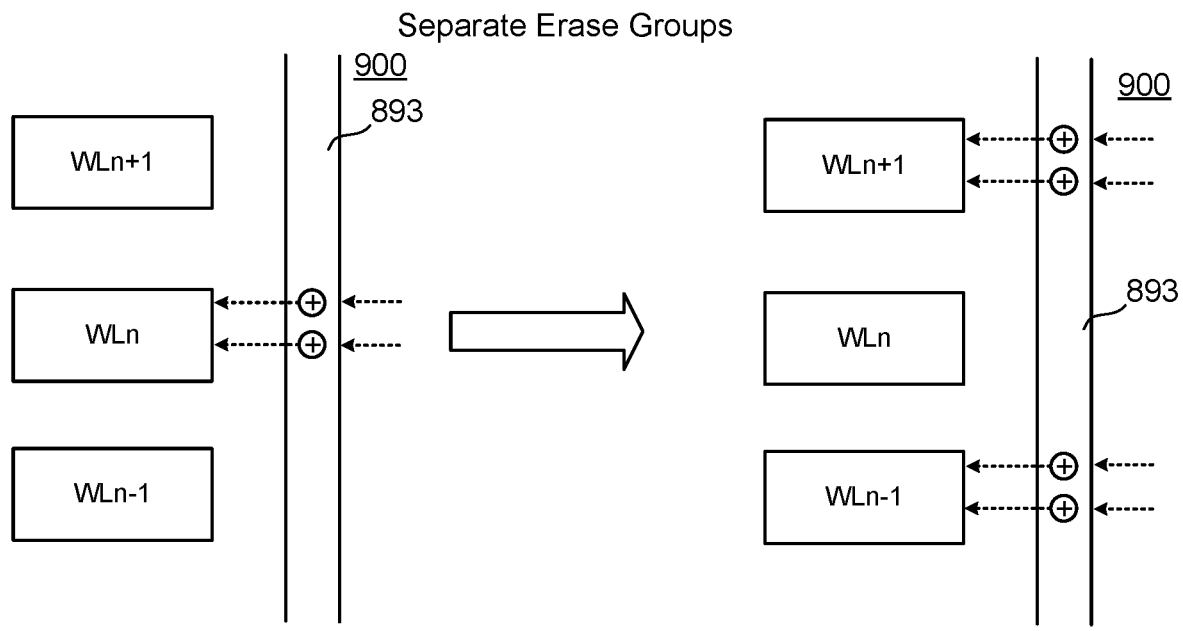
FIG. 12 depicts a portion of a NAND string experiencing erase.

FIG. 12 is a block diagram that describes the physics of the erase process for NAND string 900 using the Separate Erase Groups method. On the left side of FIG. 12, only memory cells connected to even word numbered lines are receiving WLer_en (e.g., n is an even number). On the right side of FIG. 12, only memory cells connected to odd numbered word lines are receiving WLer_en. Note that for purposes of this document, an even word line is an even numbered word line (e.g., WL0, WL2, WL4, etc.) and an odd word line is an odd numbered word line (e.g., (WL1, WL3, etc.) Because neighboring word lines are not receiving an erase enable voltage, hole injection into the space between word lines is suppressed. As a result using the Separate Erase Groups method reduces the above-described data retention issue. It has also been found that using the Separate Erase Groups method results in a tighter and more accurate erase threshold voltage distribution (e.g., see S0 of FIG. 5), which can improve programming accuracy. However, because odd word lines are erased separate from even word lines, more time is needed to erase using the Separate Erase Groups method than erasing using the All Erase method.

It has also been found that a higher erase voltage VERA is required for the Separate Erase Groups method than erasing using the All Erase method. Using a higher erase voltage VERA can degrade the tunnel oxide over time, which will decrease endurance of the memory.

Figure 13:
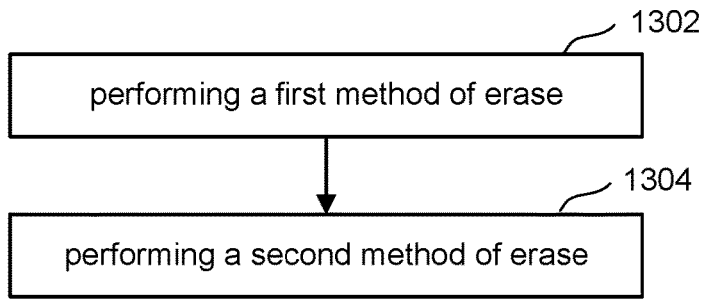
FIG. 13 is a flow chart describing one embodiment of a process for erasing non-volatile memory.

In light of the above findings, it is concluded that a newer memory will benefit from using the Separate Erase Groups method. However, as that memory gets older and used more (e.g., more program/erase cycles), the benefits are reduced and at some point it is better to use the All Erase method. Therefore, it is proposed to take advantage of the data retention benefit of the Separate Erase Groups method when the memory is new. However, once additional erase is required (e.g., higher VERA) because the memory has experienced many program/erase cycles, then switch to All Erase to avoid the stress on the tunnel oxide and mitigate the extra time needed for erase. This strategy is depicted in FIG. 13, which is a flow chart describing one embodiment of a process for erasing non-volatile memory. In step 1302, the memory system performs a first method of erase for a population of memory cells. Step 1302 is performed when the memory is new and has experienced less program/erase cycles (i.e. beginning of life or BOL). The population of memory cells may be a block, multiple blocks, a die, a portion of a block, or other grouping. In step 1304, the memory system performs a second method of erase for the same population of memory cells. Step 1304 is performed when the memory has experienced many (e.g., >3K) program/erase cycles (i.e. middle of life [MOL] or end of life [EOL]). The first method of erase is different than the second method of erase.

In one embodiment, the erase process includes applying VERA to the bit lines and source lines as a set of voltage pulses that increase in magnitude at each pulse. Each time a VERA pulse is applied for All Erase or each time a pair of equal magnitude VERA pulses are applied for Separate Erase Groups is referred to as an iteration of the erase process. In one embodiment, an erase process comprises performing steps 1302 and 1304, and the switch from step 1302 to 1304 is determined based on iteration number, magnitude of VERA or program/erase cycles number. In one embodiment, at BOL the memory system performs erase processes by only performing step 1302, at EOL the memory system performs erase processes by only performing step 1304, and between BOL and EOL (e.g., MOL) the memory system performs erase processes by performing steps 1302 and 1304, with transitions based on number of iterations needed to finish erase, magnitude of VERA needed to finish erase or program/erase cycles number.

Figure 14:
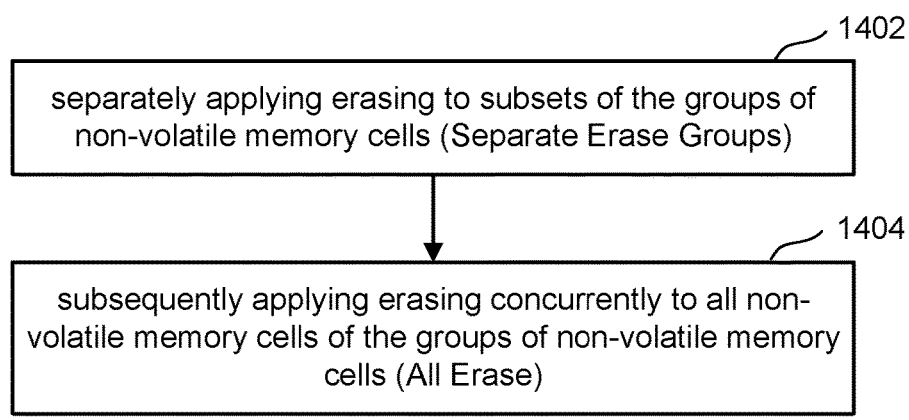
FIG. 14 is a flow chart describing one embodiment of a process for erasing non-volatile memory.

FIG. 14 is a flow chart describing one embodiment of a process for erasing non-volatile memory. The process of FIG. 14 is an example embodiment of the process of FIG. 13 in which the first method is the Separate Erase Groups method and the second method is the All Erase method. In step 1402 (an example implementation of step 1302), the memory system separately applies erasing to subsets of the groups of non-volatile memory cells (Separate Erase Groups). For example, erasing is performed for memory cells connected to even word lines separate from memory cells connected to odd word lines. In step 1404 (an example implementation of step 1304), the memory system subsequently applies erasing concurrently to all non-volatile memory cells of the groups of non-volatile memory cells (All Erase). For example, erasing is performed for all memory cells of a block or memory cells connected to all word lines for a block or other grouping.

In one embodiment, an erase process comprises performing steps 1402 and 1404, and the switch from step 1402 to 1404 is determined based on iteration number, magnitude of VERA or program/erase cycles number. In one embodiment, at BOL the memory system performs erase processes by only performing step 1402, at EOL the memory system performs erase processes by only performing step 1404, and at MOL the memory system performs erase processes by performing steps 1402 and 1404, with transitions based on number of iterations needed to finish erase, magnitude of VERA needed to finish erase or program/erase cycles number. In another embodiment, steps 1402 and 1404 can both be performed at BOL, MOL and EOL, with the transition between steps 1402 and 1404 changing from BOL to EOL.

Figure 15:
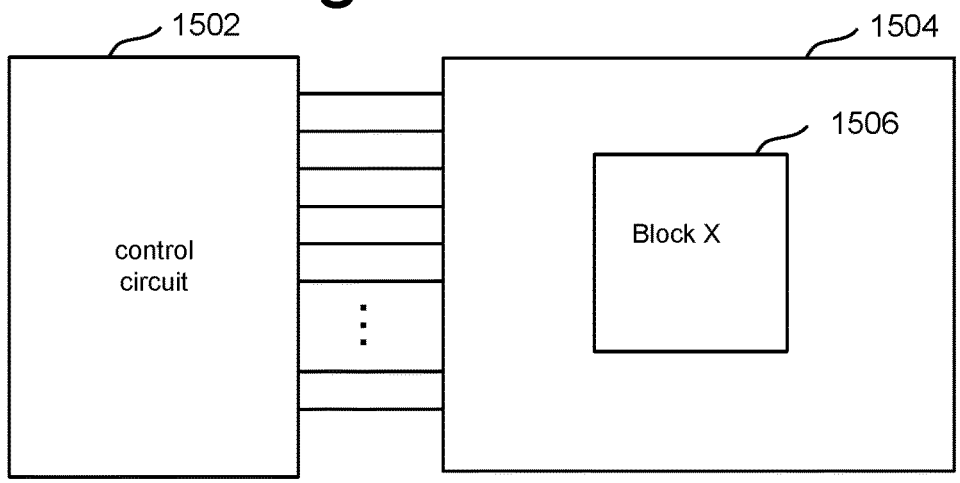
FIG. 15 is a block diagram of a portion of a non-volatile memory system.

FIG. 15 is a block diagram of a portion of a non-volatile memory system that can be used to perform the processes of FIGS. 13 and 14. FIG. 15 shows control circuit 1502 connected to memory structure 1504, which includes many non-volatile memory cells. For example, memory structure 1504 includes block 1506 (Block X), which includes a plurality of word lines connected to many non-volatile memory cells, as described above. The memory cells can be aggregated into groups, such as non-volatile memory cells connected to even word lines and non-volatile memory cells connected to odd word lines. Other grouping can also be used. Control circuit 1502 performs the processes of FIGS. 13 and/or 14 to erase the non-volatile memory cells in block 1506. Control circuit 1502 can be comprise control circuitry 310, read/write circuits 328 and decoders 324/332 of FIG. 2. In other embodiments, other circuits that support and operate on the memory structure 326 can be referred to as a control circuit. For example, in some embodiments, the controller can operate as the control circuit or can be part of the control circuit. In some embodiments, the controller in combination with control circuitry 310, read/write circuits 328 and decoders 324/332 comprise one embodiment of a control circuit. In another embodiment, state machine 312 comprises the control circuit. In another embodiment, the host can provide the control circuit. The control circuit can also be a microprocessor, microcontroller or other type of processor.

Figure 16:
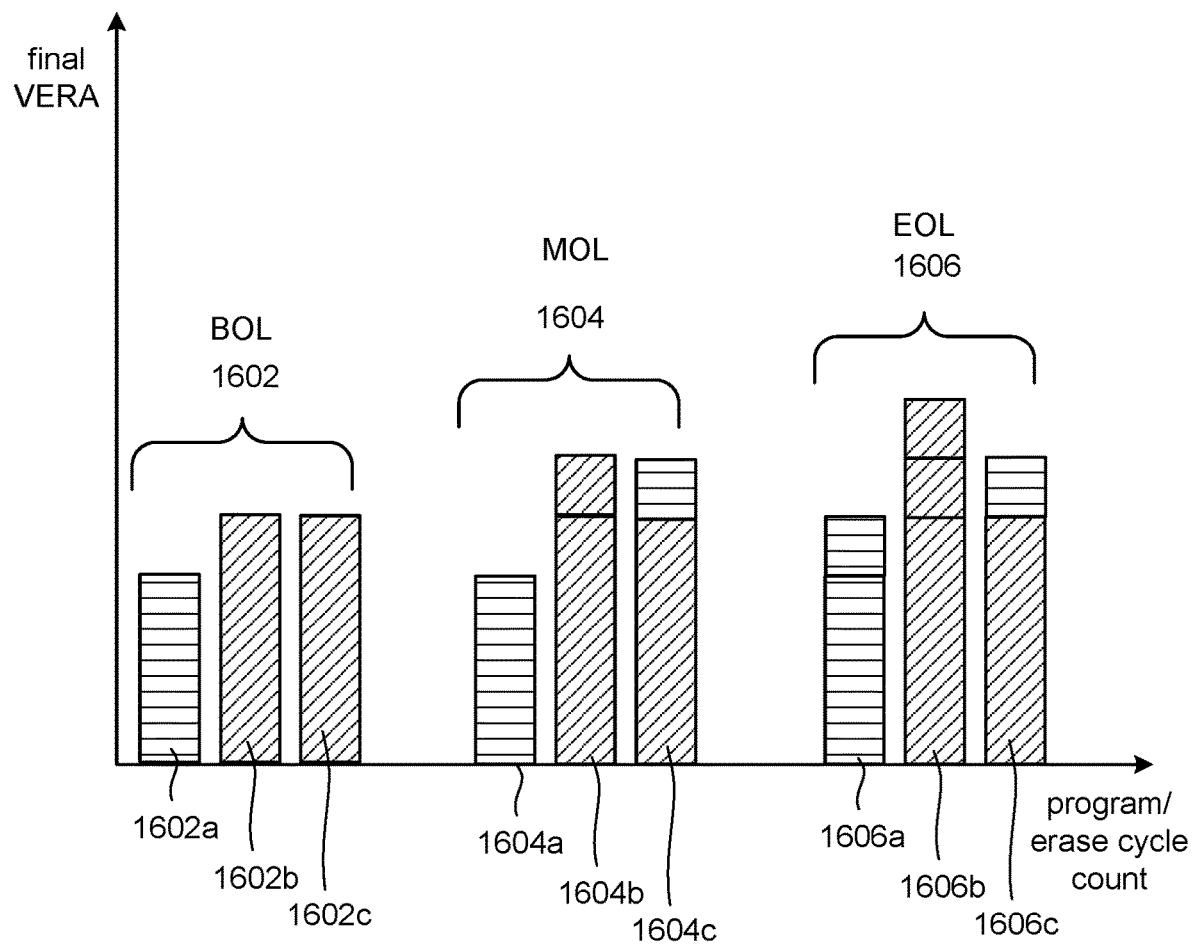
FIG. 16 is a graph depicting final magnitude of an erase voltage versus program/erase cycles for multiple types of erase processes.

FIG. 16 is a bar graph depicting final magnitude of an erase voltage versus program/erase cycles for multiple types of erase processes. The three bars 1602 represent performance at the beginning of life of the memory. The three bars 1604 represent performance at the middle of life of the memory. The three bars 1606 represent performance at the end of life of the memory. The y-axis is the magnitude of VERA at the end of a successful erase process. Bars 1602a, 1604a and 1606a represent using only the All Erase method. Bars 1602b, 1604b and 1606b represent using only the Separate Erase Groups method. As can be seen, bar 1602b is higher than bar 1602a (e.g., ~0.6v higher), indicating that the Separate Erase Groups method requires a higher VERA to successfully complete erasing the memory cells. Bar 1604b is higher than bar 1602b and bar 1606b is higher than bar 1604b, indicating that over time (and after usage of the memory) the Separate Erase Groups method requires a higher VERA to successfully complete erasing the memory cells.

Bars 1602c, 1604c and 1606c represent one example embodiment of the proposed technology for erasing non-volatile memory cells. At beginning of life (e.g., BOL 1602), only the Separate Erase Groups method is used. At middle of life (e.g., MOL 1604) and at end of life (e.g., EOL 1606) both the Separate Erase Groups method and the All Erase method are used. In an alternative embodiment: at beginning of life (e.g., BOL 1602), only the Separate Erase Groups method is used; at middle of life (e.g., MOL 1604) both the Separate Erase Groups method and the All Erase method are used; and at end of life (e.g., EOL 1606) only the All Erase method are used. In another alternative, both the Separate Erase Groups method and the All Erase method are used at BOL, MOL and EOL.

Figure 17:
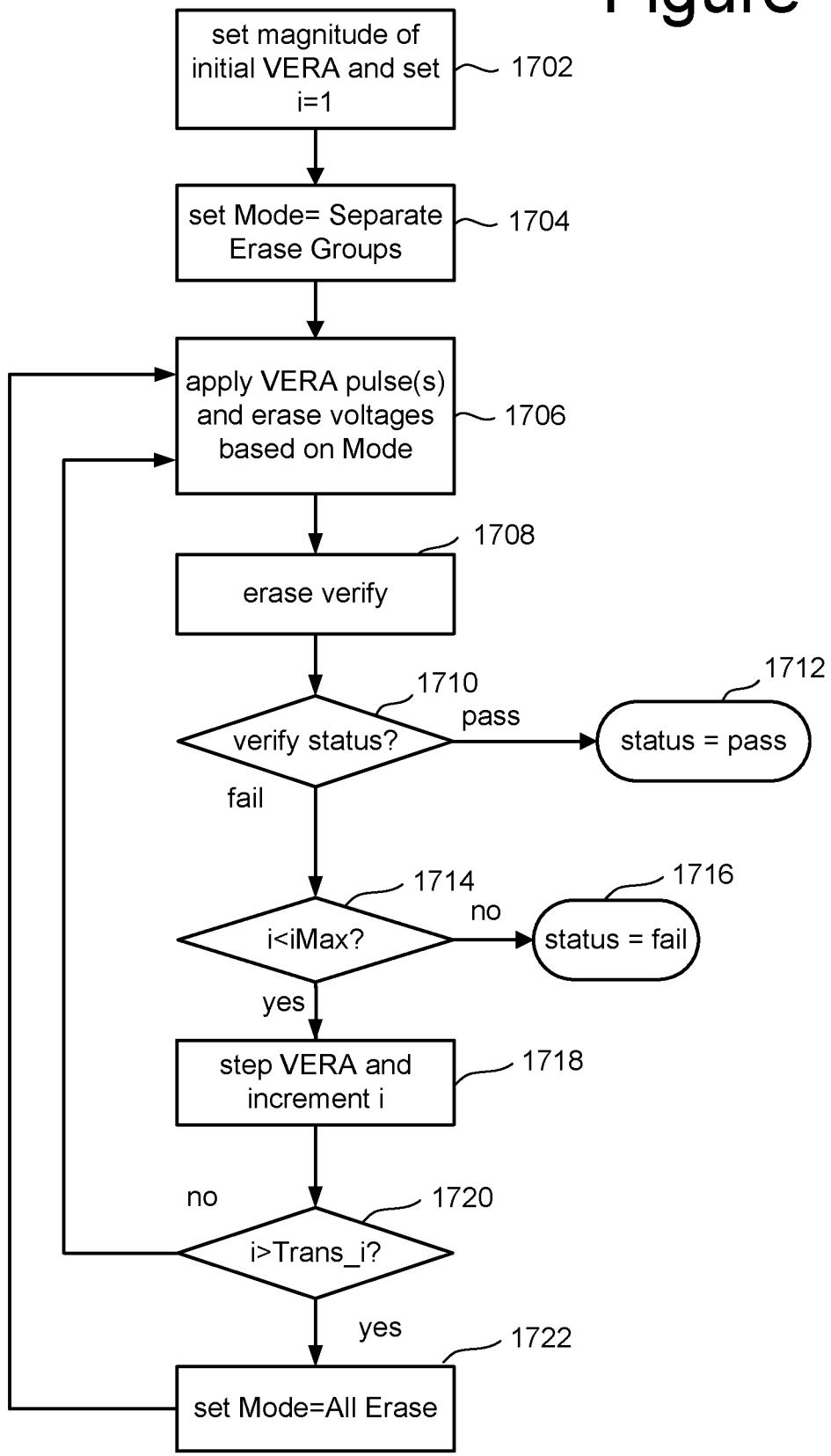
FIG. 17 is a flow chart describing one embodiment of a process for erasing non-volatile memory.

FIG. 17 is a flow chart describing one embodiment of a process for erasing non-volatile memory. The process of FIG. 17 is an example implementation of the processes of FIG. 13 and/or FIG. 14. In one embodiment, the process of FIG. 17 is performed by any of the control circuits described above. In step 1702, the control circuit sets the initial magnitude of VERA and sets the iteration loop number i=1. As discussed above, VERA is the erase voltage applied to the bit line and/or source line. In one embodiment, the erase process includes applying VERA to the bit lines and/or source lines as a set of pulses that increase magnitude at each pulse. Step 1702 sets the voltage magnitude of the first VERA voltage pulse. Each time a VERA pulse is applied for All Erase and each time a pair of equal magnitude VERA pulses are applied for Separate Erase Groups is referred to as an iteration of the erase process. The first iteration is i=0. In step 1704, the erase Mode is set to be the Separate Erase Groups method. The control circuit can have a register, flag or other setting to indicate which type of erase method is currently being used. For example, parameters 318 (see FIG. 2) can store an indication of which type of erase method is currently being used. In step 1706, since the erase Mode is set to be the Separate Erase Groups method, two VERA pulses of the same magnitude are applied to the bit lines and/or source lines (or p-well). During the first VERA pulse, the even word lines receive WLer_en and the odd word lines receive WLer_inh. During the second VERA pulse, the odd word lines receive WLer_en and the even word lines receive WLer_inh. In step 1708 erase verify is performed by testing whether all of the memory cells being erased (e.g., block or other grouping) have a threshold voltage within the threshold voltage distribution for the erased data state (e.g., S0 of FIG. 5). For example, all of the word lines can receive a common voltage (or only the odd word line or only the even word lines) and the control circuit will test the magnitude of the current through the channel of the NAND string. No one particular method for verifying erase is required for the proposed technology and any suitable verification operation is acceptable.

If the verify process indicates that all memory cells of all NAND strings have successfully passed erase verification (step 1710), then in step 1712 a status of "pass" is reported and the erase process ends successfully. If not all memory cells of all NAND strings have successfully passed erase verification then in step 1714 it is determined whether the number of iterations of the erase process has reached the maximum number of iterations (i<iMax). If the number of iterations (i) of the erase process has reached the maximum number of iterations (iMax), then the erase has failed (1716). In one embodiment, iMax=6. In one embodiment the value of iMax is stored in parameters 318 (see FIG. 2). If the number of iterations of the erase process has not reached the maximum number of iterations, then the erase process continues at step 1718 during which the erase voltage signal VERA is stepped up to the next magnitude. In one embodiment, VERA is increased by a step size (e.g., 0.4v) for each iteration of the erase process. Additionally, the iteration loop number i is increased by 1. In step 1720, it is determined whether the iteration loop number i is greater than a transition threshold (Trans_i). In one embodiment, Trans_i=3, which means that the erase process of FIG. 17 starts by performing the Separate Erase Groups method and transitions to performing the ALL Erase method after the third iteration (before the fourth iteration). Thus, if i is not greater than the transition threshold Trans_i, then the Mode does not change and the process loops back to step 1706 so that another set of VERA pulses are applied. If i is greater than the transition threshold (Trans_i), then the Mode does change to All Erase (step 1722) and the process loops back to step 1706 so that a VERA pulse is applied. When step 1706 is performed and the erase Mode is set to ALL Erase, one VERA pulse is applied (at a magnitude higher than the previous VERA pulse by the step size) and all of the word lines receive WLer_en. In one embodiment, the transition threshold (Trans_i) is stored in parameters 318 (see FIG. 2).

Note that steps 1706-1718 represent an iteration of the erase process. As can be seen, the erase process of FIG. 17 can include performing multiple iterations (e.g., performing steps 1706-1718 multiple times).

FIG. 17 represents an embodiment where the transition from a first method of erase to a second method of erase is based on iteration number (i). In an alternative embodiment, the transition from a first method of erase to a second method of erase is based on the magnitude of VERA or program/erase cycle count. In another embodiment of FIG. 17, the erase process starts by performing All Erase and transitions to the Separate Erase Groups method.

In another embodiment, if the magnitude of VERA reaches a maximum value, then the control circuit stops stepping up (incrementing) VERA for future iterations of the erase process.

The process of FIG. 17 is an example of performing multiple iterations of an erase process to erase a group (e.g., a block) of non-volatile memory cells, where each iteration of the erase process includes applying an erase voltage to the group of non-volatile memory cells as one or more voltage pulses. During the first iteration of one embodiment of the erase process a first method of erase is performed (e.g., Separate Erase Groups). At some point during the erase process of FIG. 17, the erase process switches (e.g., step 1722) from performing the first method of erase to performing a second method of erase (e.g., All Erase) for one or more additional iterations of the erase process after a metric has exceeded a threshold (e.g., i>Trans_i).

Figure 18:
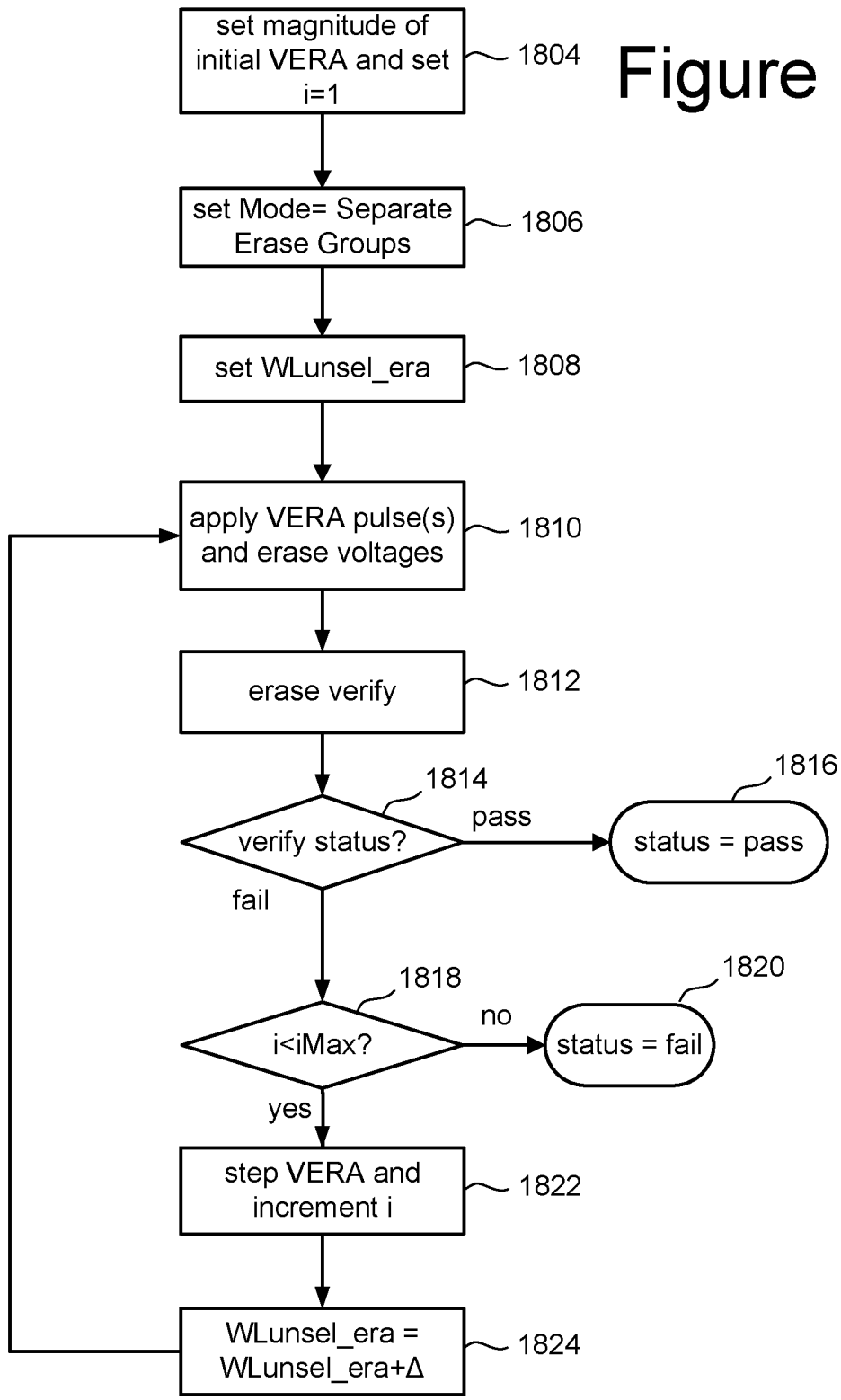
FIG. 18 is a flow chart describing one embodiment of a process for erasing non-volatile memory.

FIG. 18 is a flow chart describing one embodiment of a process for erasing non-volatile memory. The process of FIG. 18 is an example implementation of the processes of FIG. 13 and/or FIG. 14. In one embodiment, the process of FIG. 18 is performed by any of the control circuits described above. In step 1804, the control circuit sets the initial magnitude of VERA and sets the iteration loop number i=1. In step 1806, the erase Mode is set to be the Separate Erase Groups method. In step 1808, the control circuit sets the unselected word line voltage WLunsel_era. As discussed above, during the Separate Erase Groups method some word lines are selected for erase enable and some word lines are unselected. The selected word lines receive an erase enable voltage (e.g., WLer_en). The unselected word lines receive the unselected word line voltage WLunsel_era. For example, in the embodiment with even/odd erase, when even word lines receive erase enable voltage WLer_en the odd word lines receive WLunsel_era and when odd word lines receive erase enable voltage WLer_en the even word lines receive WLunsel_era. In one embodiment, step 1808 includes setting the unselected word line voltage WLunsel_era=WLer_inh (e.g., 10v).

In step 1810, since the erase Mode is set to be the Separate Erase Groups method, two VERA pulses of the same magnitude are applied to the bit lines and/or source lines (or p-well). During the first VERA pulse, the even word lines receive WLer_en and the odd word lines receive WLunsel_era. During the second VERA pulse, the odd word lines receive WLer_en and the even word lines receive WLunsel_era. In step 1812, erase verify is performed. If the verify process indicates that all memory cells of all NAND strings have successfully passed erase verification (step 1814), then in step 1816 a status of "pass" is reported and the erase process ends successfully. If not all memory cells of all NAND strings have successfully passed erase verification then in step 1818 it is determined whether the number of iterations of the erase process has reached the maximum number of iterations (i<iMax). If the number of iterations of the erase process has reached the maximum number of iterations, then the erase has failed (1820). If the number of iterations of the erase process has not reached the maximum number of iterations, then the erase process continues at step 1822 during which the erase voltage signal VERA is stepped up to the next magnitude. Additionally, the iteration loop number i is increase by 1. Steps 1812, 1814, 1816 1818, 1820 and 1822 of FIG. 18 are similar to steps 1708, 1710, 1712, 1714, 1716 and 1718 of FIG. 17.

In step 1824, the unselected word line voltage WLunsel_era is adjusted/changed for the next iteration by Δ. In one embodiment, Δ has a negative value such that WLunsel_era is reduced at each iteration such that WLunsel_era approaches WLer_en over time. After step 1824, the erase process of FIG. 18 loops back to step 1810 to perform another iteration. Note that steps 1810-1822 represents an iteration of the erase process. As can be seen, the erase process of FIG. 18 can include performing multiple iterations (e.g., performing steps 1810-1822 multiple times). In one embodiment, the value of Δ is stored in parameters 318 (see FIG. 2).

In another embodiment of FIG. 18, if the magnitude of VERA reaches a maximum value, then the control circuit stops stepping up (incrementing) VERA for future iterations of the erase process. Similarly, step 1824 can be adjusted so that WLunsel_era is not changed if it has exceeded a limit.

In some embodiments of FIG. 18, the control circuit is configured to perform the erase process for the group of non-volatile memory cells by separately applying erasing to subsets of the group of non-volatile memory cells and subsequently applying erasing concurrently to all non-volatile memory cells of the group of non-volatile memory cells by applying doses of an erase signal (e.g., VERA pulses or other wave forms) during the process of FIG. 18. During a first set of the doses of the erase signal a first set of word lines (e.g., even word lines) are selected for erasing and during a second set of the doses of the erase signal a second set of word lines (e.g., odd word lines) are selected for erasing. During the first set of doses of the erase signal, a first erase enable voltage (e.g., WLer_en) is applied to the first set of word lines and a first unselected word line voltage (e.g., WLunsel_era) is applied to the second set of word lines in step 1810. The first unselected word line voltage being applied to the second set of word lines for the first set of doses of the erase voltage is changed such that the first unselected word line voltage approaches the first erase enable voltage over time during the first set of doses of the erase voltage (step 1824). During the second set of doses of the erase signal, a second erase enable voltage (e.g., WLer_en) is applied to the second set of word lines and a second unselected word line voltage (e.g., WLunsel_era) is applied to the first set of word lines (step 1810). The second unselected word line voltage being applied to the first set of word lines for the second set of doses of the erase voltage is changed such that the second unselected word line voltage approaches the erase enable voltage over time during the second set of doses of the erase voltage (step 1824).

The process of FIG. 18 is an example of performing multiple iterations of an erase process to erase a group (e.g., a block) of non-volatile memory cells, where each iteration of the erase process includes applying an erase voltage to the group of non-volatile memory cells as one or more voltage pulses. During the first iteration of one embodiment of the erase process a first method of erase is performed (e.g., Separate Erase Groups). At some point during some embodiments of the erase process of FIG. 18, unselected word line voltage (e.g., WLunsel_era) is lowered to the point where the erase process switches from performing the first method of erase to performing a second method of erase (e.g., All Erase) for one or more additional iterations of the erase process.

Figure 19:
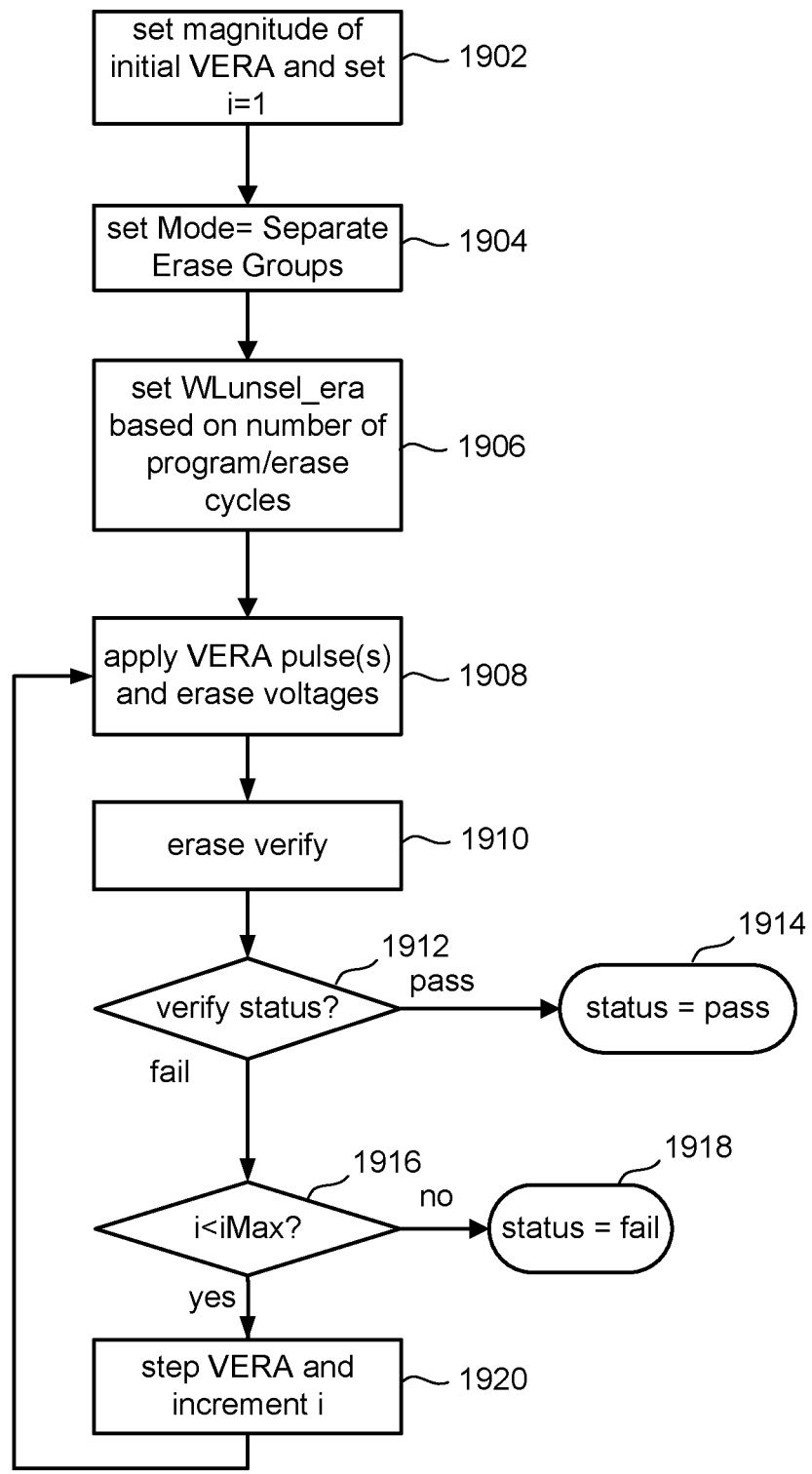
FIG. 19 is a flow chart describing one embodiment of a process for erasing non-volatile memory.

FIG. 19 is a flow chart describing one embodiment of a process for erasing non-volatile memory. The process of FIG. 19 is an example implementation of the processes of FIG. 13 and/or FIG. 14. In one embodiment, the process of FIG. 19 is performed by any of the control circuits described above. In step 1902, the control circuit sets the initial magnitude of VERA and sets the iteration loop number i=1. In step 1904, the erase Mode is set to be the Separate Erase Groups method. In step 1906, the control circuit sets the unselected word line voltage WLunsel_era based on the number of program/erase cycles performed for the population of memory cells being erased. In one embodiment, every time an erase process is performed, the number of program/erase cycles is incremented. The number of program/erase cycles can be maintained at any level of granularity including at the block level, sub-block level, word line level, die level, plane level, page level, etc. The embodiment of FIG. 19 has the unselected word line voltage approaching the erase enable voltage over time across multiple erase processes and over the life of the memory. Steps 1908-1920 of FIG. 19 are the same as steps 1810-1822 of FIG. 18. After step 1920, the process of FIG. 19 loops back to step 1908 to perform another iteration of the erase process. Note that steps 1908-1920 of FIG. 19 represent an iteration of the erase process.

A system has been proposed to improve the erase process by utilizing multiple (e.g., two or more) methods of erasing. A first method of erasing is more relied on at the beginning of life of the memory system. A second method of erasing is increasingly relied on as the memory system is used and undergoes many program/erase cycles.

One embodiment includes a non-volatile memory system comprising a group of non-volatile memory cells and a control circuit connected to the group of non-volatile memory cells. The control circuit is configured to perform an erase process for the group of non-volatile memory cells by separately applying erasing to subsets of the group of non-volatile memory cells and subsequently applying erasing concurrently to all non-volatile memory cells of the group of non-volatile memory cells.

One embodiment includes a method, comprising: performing multiple iterations of an erase process to erase a group of non-volatile memory cells, each iteration of the erase process includes applying an erase voltage to the group of non-volatile memory cells as one or more voltage pulses, a first iteration of the erase process includes performing a first method of erase while applying the erase voltage to the group of non-volatile memory cells; and switching from performing the first method of erase to performing a second method of erase for one or more additional iterations of the erase process after a metric has exceeded a threshold.

One embodiment includes a method of erasing non-volatile memory comprising: prior to a group of non-volatile memory cells being subjected to a number of program/erase cycles, erasing the group of non-volatile memory cells by performing a first method of erase; and subsequent to the group of non-volatile memory cells being subjected to the number of program/erase cycles cycle, erasing the group of non-volatile memory cells by performing a second method of erase.

One embodiment includes a non-volatile memory system comprising a group of non-volatile memory cells and a control circuit connected to the group of non-volatile memory cells. The control circuit is configured to erase the group of non-volatile memory cells by performing iterations of an erase process. The control circuit is configured to, during each iteration, apply a first selected erase enable voltage to a first set of word lines while applying a first unselected erase voltage to a second set of word lines and subsequently apply a second selected erase enable voltage to the second set of word lines while applying a second unselected erase voltage to the first set of word lines. The control circuit is configured to change the first unselected erase voltage and the second unselected erase voltage over time while performing the iterations of the erase process such that the first unselected erase voltage approaches the first selected erase enable voltage and the second unselected erase voltage approaches the second selected erase enable voltage.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile memory system, comprising:
    a group of non-volatile memory cells; and
    a control circuit connected to the group of non-volatile memory cells, the control circuit is configured to perform an erase process for the group of non-volatile memory cells by separately in time performing an erase operation on each subset of subsets of the group of non-volatile memory cells and subsequently performing an erase operation concurrently on all non-volatile memory cells of the group of non-volatile memory cells.

2. The non-volatile memory system of claim 1, further comprising:
    a set of word lines connected to the group of non-volatile memory cells and the control circuit, the control circuit is configured to separately in time performing an erase operation on each subset of subsets of the group of non-volatile memory cells by applying a first erase enable voltage to a first subset of the non-volatile memory cells connected to a first subset of the word lines while applying a first erase inhibit voltage to a second subset of the non-volatile memory cells connected to a second subset of the word lines followed by applying a second erase enable voltage to the second subset of the non-volatile memory cells connected to the second subset of the word lines while applying a second erase inhibit voltage to the first subset of the non-volatile memory cells connected to the first subset of the word lines.

3. The non-volatile memory system of claim 2, wherein:
the control circuit is configured to performing an erase operation concurrently on all non-volatile memory cells of the group of non-volatile memory cells by concurrently applying an erase enable voltage to all of the word lines of the set of word lines.

4. The non-volatile memory system of claim 1, wherein:
the erase process comprises a set of multiple iterations of applying an erase signal to the group of non-volatile memory cells; and
the control circuit is configured to switch between separately in time performing an erase operation on each subset of subsets of the group of non-volatile memory cells and subsequently performing an erase operation concurrently on all non-volatile memory cells of the group of non-volatile memory cells based on iteration count of the erase process.

5. The non-volatile memory system of claim 1, wherein:
the erase process comprises a set of multiple iterations of applying an erase signal to the group of non-volatile memory cells;
the control circuit is configured to increase the erase signal for each iteration of the multiple iterations; and
the control circuit is configured to switch between separately in time performing an erase operation on each subset of subsets of the group of non-volatile memory cells and subsequently performing an erase operation concurrently on all non-volatile memory cells of the group of non-volatile memory cells based on magnitude of the erase signal.

6. The non-volatile memory system of claim 1, wherein:
the control circuit is configured to program the group of non-volatile memory cells; and
the control circuit is configured to switch between separately in time performing an erase operation on each subset of subsets of the group of non-volatile memory cells and subsequently performing an erase operation concurrently on all non-volatile memory cells of the group of non-volatile memory cells based on a number of program/erase cycles performed on the group of non-volatile memory cells.

7. The non-volatile memory system of claim 1, wherein:
the control circuit is configured to program the group of non-volatile memory cells;
the control circuit is configured to separately in time performing an erase operation on each subset of subsets of the group of non-volatile memory cells and subsequently performing an erase operation concurrently on all non-volatile memory cells of the group of non-volatile memory cells after a number of program/erase cycles are performed on the group of non-volatile memory cells; and
the control circuit configured to separately in time perform an erase operation on each subset of subsets of the group of non-volatile memory cells without subsequently performing an erase operation concurrently on all non-volatile memory cells of the group of non-volatile memory cells before the number of program/erase cycles are performed on the group of non-volatile memory cells.

8. The non-volatile memory system of claim 1, further comprising:
a set of word lines connected to the group of non-volatile memory cells and the control circuit;
the control circuit is configured to perform the erase process for the group of non-volatile memory cells by separately in time performing an erase operation on each subset of subsets of the group of non-volatile memory cells and subsequently performing an erase operation concurrently on all non-volatile memory cells of the group of non-volatile memory cells by:
applying doses of an erase signal, during a first set of the doses of the erase signal a first set of word lines are selected for erasing and during a second set of the doses of the erase signal a second set of word lines are selected for erasing;
during the first set of doses of the erase signal, applying a first erase enable voltage to the first set of word lines and applying a first unselected word line voltage to the second set of word lines;
changing the first unselected word line voltage being applied to the second set of word lines for the first set of doses of the erase voltage such that the first unselected word line voltage approaches the first erase enable voltage over time during the first set of doses of the erase voltage;
during the second set of doses of the erase signal, applying a second erase enable voltage to the second set of word lines and applying a second unselected word line voltage to the first set of word lines; and
changing the second unselected word line voltage being applied to the first set of word lines for the second set of doses of the erase voltage such that the second unselected word line voltage approaches the erase enable voltage over time during the second set of doses of the erase voltage.

9. The non-volatile memory system of claim 1, further comprising:
a set of word lines connected to the group of non-volatile memory cells and the control circuit, the control circuit is configured to perform the erase process for the group of non-volatile memory cells by separately in time performing an erase operation on each subset of subsets of the group of non-volatile memory cells and subsequently performing an erase operation concurrently on all non-volatile memory cells of the group of non-volatile memory cells by performing iterations of the erase process, during each iteration the control circuit is configured to apply a first erase enable voltage to a first set of word lines while applying a first unselected word line voltage to a second set of word lines and apply a second erase enable voltage to the second set of word lines while applying a second unselected word line voltage to the first set of word lines, the control circuit is configured to decrease the first unselected word line voltage and the second unselected word line voltage over time while performing the iterations of the erase process.

10. The non-volatile memory system of claim 9, wherein:
the control circuit is configured to decrease the first unselected erase voltage and the second unselected erase voltage over time based on number of iterations performed for the erase process.

11. A method, comprising:
performing multiple iterations of an erase process to erase a group of non-volatile memory cells, the group of non-volatile memory cells are connected to a set of word lines, each iteration of the erase process includes applying an erase voltage to the group of non-volatile memory cells as one or more voltage pulses, a first iteration of the erase process includes performing a first method of erase that comprises applying an erase enable voltage separately in time to different subsets of the word lines while word lines not receiving the erase enable voltage receive an erase inhibit voltage; and
switching from performing the first method of erase to performing a second method of erase for one or more additional iterations of the erase process after a metric has exceeded a threshold, the second method of erase includes applying an erase enable voltage concurrently to all the different subsets of the word lines.

12. The method of claim 11, wherein:
the first method of erase includes applying the erase enable voltage to even word lines while odd word lines receive the erase inhibit voltage and applying the erase enable voltage to odd word lines while even word lines receive an erase inhibit voltage; and
the second method of erase includes concurrently applying the erase enable voltage to odd word lines and even word lines.

13. The method of claim 11, wherein:
the metric is a number of iterations.

14. The method of claim 11, wherein:
the metric is a number of program/erase cycles for the group of non-volatile memory cells.

15. The method of claim 11, wherein:
the first method of erase includes applying the erase enable voltage to even word lines while odd word lines receive the erase inhibit voltage and applying the erase enable voltage to odd word lines while even word lines receive an erase inhibit voltage;
the second method of erase includes concurrently applying the erase enable voltage to odd word lines and even word lines;
the metric is a number of iterations;
the method further comprises performing erase verify during each iteration of the erase process; and
the group of non-volatile memory cells are a block of non-volatile memory cells.

16. A non-volatile memory system, comprising:
a group of non-volatile memory cells; and
a control circuit connected to the group of non-volatile memory cells, the control circuit is configured to erase the group of non-volatile memory cells by performing iterations of an erase process, during each iteration the control circuit is configured to apply a first selected erase enable voltage to a first set of word lines while applying a first unselected erase voltage to a second set of word lines and subsequently apply a second selected erase enable voltage to the second set of word lines while applying a second unselected erase voltage to the first set of word lines, and the control circuit is configured to change the first unselected erase voltage and the second unselected erase voltage over time while performing the iterations of the erase process such that the first unselected erase voltage approaches the first selected erase enable voltage and the second unselected erase voltage approaches the second selected erase enable voltage.

17. The non-volatile memory system of claim 16, wherein:
the control circuit is configured to change the first unselected erase voltage and the second unselected erase voltage over time based on a number of iterations of the erase process.

18. The non-volatile memory system of claim 16, wherein:
the control circuit is configured to apply an erase voltage to the group of memory cells during each iterations of the erase process;
the control circuit is configured to change the first unselected erase voltage and the second unselected erase voltage over time based on magnitude of the erase voltage;
the first selected erase enable voltage is same in magnitude as the second selected erase enable voltage; and
the first unselected erase voltage is same in magnitude as the second unselected erase voltage.

* * * * *